US010923456B2

(12) United States Patent
Fricker

(10) Patent No.: US 10,923,456 B2
(45) Date of Patent: Feb. 16, 2021

(54) SYSTEMS AND METHODS FOR HIERARCHICAL EXPOSURE OF AN INTEGRATED CIRCUIT HAVING MULTIPLE INTERCONNECTED DIE

(71) Applicant: Cerebras Systems Inc., Los Altos, CA (US)

(72) Inventor: Jean-Philippe Fricker, Los Altos, CA (US)

(73) Assignee: Cerebras Systems Inc., Los Altos, CA (US)

( * ) Notice: Subject to any disclaimer, the term of this patent is extended or adjusted under 35 U.S.C. 154(b) by 0 days.

(21) Appl. No.: 16/717,848

(22) Filed: Dec. 17, 2019

(65) Prior Publication Data

US 2020/0203308 A1    Jun. 25, 2020

Related U.S. Application Data

(60) Provisional application No. 62/782,826, filed on Dec. 20, 2018.

(51) Int. Cl.
*G03F 7/20* (2006.01)
*H01L 23/00* (2006.01)
*H01L 21/66* (2006.01)

(52) U.S. Cl.
CPC .............. *H01L 24/94* (2013.01); *G03F 7/20* (2013.01); *G03F 7/70466* (2013.01); *G03F 7/70475* (2013.01); *H01L 22/14* (2013.01); *H01L 24/25* (2013.01); *H01L 24/49* (2013.01); *H01L 2223/5446* (2013.01); *H01L 2223/54466* (2013.01); *H01L 2224/24137* (2013.01); *H01L 2224/25171* (2013.01); *H01L 2224/43985* (2013.01); *H01L 2224/48137* (2013.01); *H01L 2224/49171* (2013.01);
(Continued)

(58) Field of Classification Search
CPC ......... H01L 24/35; H01L 24/41; H01L 24/43; H01L 24/49; H01L 24/94; H01L 24/25; H01L 2224/43985; H01L 2224/48137; H01L 2224/24137; H01L 2224/49179; H01L 2224/25171; H01L 2224/49171; H01L 2224/94; H01L 2224/49177; H01L 2223/5446; G06F 3/041; G06F 3/04164; G06F 3/0416; G03F 7/70466; G03F 7/70433; G03F 7/70475
See application file for complete search history.

(56) References Cited

U.S. PATENT DOCUMENTS 4,467,400 A * 8/1984 Stopper ............... G01R 31/2884
                                                          174/261
5,146,308 A * 9/1992 Chance ................... H01L 24/02
                                                          257/782

(Continued)

*Primary Examiner* — Sophia T Nguyen
(74) *Attorney, Agent, or Firm* — Jeffrey Schox

(57) ABSTRACT

A system and method for fabricating distinct types of circuit connections on a semiconductor wafer includes fabricating, using a first photomask, a plurality of a first type of circuit connections for each of a plurality of distinct die of a semiconductor wafer; and fabricating, using a second photomask, a plurality of a second type of circuit connections between a plurality of distinct pairs of components of the semiconductor wafer, wherein each distinct pair of components includes at least one distinct die of the plurality of distinct die and one of a conductive pad and a sacrificial die.

20 Claims, 15 Drawing Sheets

(52) U.S. Cl.
CPC .............. *H01L 2224/49176* (2013.01); *H01L 2224/49177* (2013.01); *H01L 2224/94* (2013.01); *H01L 2224/95001* (2013.01); *H01L 2224/97* (2013.01)

(56) References Cited

U.S. PATENT DOCUMENTS

| | | | | |
|---|---|---|---|---|
| 5,360,747 | A * | 11/1994 | Larson | G06F 11/2273 148/DIG. 162 |
| 5,539,224 | A * | 7/1996 | Ema | G03F 7/70433 257/210 |
| 5,561,606 | A * | 10/1996 | Ota | G03F 9/7003 430/22 |
| 5,576,554 | A * | 11/1996 | Hsu | G06F 11/2051 257/207 |
| 5,705,425 | A * | 1/1998 | Miura | H01L 27/12 438/106 |
| 5,731,222 | A * | 3/1998 | Malloy | H01L 24/05 257/784 |
| 5,801,406 | A * | 9/1998 | Lubow | H01L 27/11807 257/202 |
| 5,859,690 | A * | 1/1999 | Toguchi | G03F 7/70733 355/53 |
| 6,182,369 | B1 * | 2/2001 | Hirano | G03F 7/70383 33/1 M |
| 6,287,949 | B1 * | 9/2001 | Mori | H01L 23/49805 257/E23.061 |
| 6,479,887 | B1 * | 11/2002 | Yoon | H01L 23/3114 257/666 |
| 6,653,025 | B2 * | 11/2003 | Nishi | G03F 7/70358 430/5 |
| 6,824,958 | B2 * | 11/2004 | Hayano | G03F 1/26 430/311 |
| 6,842,225 | B1 * | 1/2005 | Irie | G03F 7/70475 355/53 |
| 6,953,956 | B2 * | 10/2005 | Or-Bach | H01L 23/525 257/203 |
| 7,557,439 | B1 * | 7/2009 | Sasaki | H01L 24/94 257/686 |
| 7,608,919 | B1 * | 10/2009 | Bernstein | H01L 23/60 257/685 |
| 7,846,772 | B2 * | 12/2010 | Sasaki | H01L 21/6835 257/686 |
| 7,889,320 | B2 * | 2/2011 | Ohya | G03F 7/70066 355/53 |
| 7,915,083 | B1 * | 3/2011 | Sasaki | H01L 24/03 257/777 |
| 8,012,802 | B2 * | 9/2011 | Sasaki | H01L 25/50 438/109 |
| 8,362,602 | B2 * | 1/2013 | Sasaki | H01L 23/5382 257/686 |
| 8,728,722 | B2 * | 5/2014 | Fabinski | G03F 7/70633 430/394 |
| 8,952,921 | B2 * | 2/2015 | Huang | G06F 3/044 345/174 |
| 9,190,390 | B2 | 11/2015 | Gong | H01L 24/19 |
| 9,263,420 | B2 * | 2/2016 | Vincent | H01L 25/0657 |
| 9,443,838 | B2 * | 9/2016 | Yang | H01L 27/0207 |
| 9,793,240 | B2 * | 10/2017 | Leung | H01L 23/4952 |
| 9,935,079 | B1 * | 4/2018 | Foong | H01L 24/73 |
| 10,090,233 | B2 * | 10/2018 | Carney | H01L 23/49562 |
| 10,242,891 | B2 * | 3/2019 | Fricker | H01L 25/50 |
| 10,332,860 | B2 * | 6/2019 | Fricker | H01L 24/82 |
| 10,361,172 | B2 * | 7/2019 | Fricker | H01L 23/564 |
| 10,453,717 | B2 * | 10/2019 | Fricker | H01R 43/007 |
| 10,468,369 | B2 * | 11/2019 | Fricker | H01L 24/83 |
| 2003/0015792 | A1 * | 1/2003 | Urakawa | G11C 5/04 257/724 |
| 2003/0082890 | A1 * | 5/2003 | Eldridge | H01L 21/6836 438/460 |
| 2003/0103196 | A1 * | 6/2003 | Hirukawa | G03F 7/2022 355/55 |
| 2003/0218262 | A1 * | 11/2003 | Saga | H01L 21/561 257/787 |
| 2004/0036846 | A1 * | 2/2004 | Nishi | G03F 7/70358 355/18 |
| 2004/0169833 | A1 * | 9/2004 | Tanaka | G03B 27/42 355/53 |
| 2004/0224236 | A1 * | 11/2004 | Sturtevant | G03F 7/70433 430/5 |
| 2005/0241853 | A1 * | 11/2005 | Aoki | G02F 1/1345 174/261 |
| 2006/0214288 | A1 * | 9/2006 | Ohsumi | H01L 24/97 257/724 |
| 2007/0003841 | A1 * | 1/2007 | Choi | G03F 1/28 430/5 |
| 2008/0081423 | A1 * | 4/2008 | Sadwick | H01L 24/32 438/288 |
| 2008/0102539 | A1 * | 5/2008 | Tong | H01L 24/93 438/6 |
| 2009/0008799 | A1 * | 1/2009 | Lee | G01R 31/31704 257/777 |
| 2009/0026603 | A1 * | 1/2009 | Sasaki | H01L 23/147 257/691 |
| 2009/0286358 | A1 * | 11/2009 | Yang | H01L 27/0207 438/121 |
| 2009/0321956 | A1 * | 12/2009 | Sasaki | H01L 21/6835 257/777 |
| 2010/0028788 | A1 * | 2/2010 | Saito | G03F 1/44 430/5 |
| 2010/0133677 | A1 * | 6/2010 | Murayama | H01L 21/568 257/686 |
| 2010/0200977 | A1 * | 8/2010 | Sasaki | H01L 24/24 257/690 |
| 2011/0073996 | A1 * | 3/2011 | Leung | H01L 23/4952 257/620 |
| 2011/0180932 | A1 * | 7/2011 | Sasaki | H01L 21/6835 257/774 |
| 2011/0187002 | A1 * | 8/2011 | Kishii | H01L 24/97 257/773 |
| 2011/0189820 | A1 * | 8/2011 | Sasaki | H01L 25/50 438/107 |
| 2014/0167292 | A1 * | 6/2014 | Masumura | H01L 25/18 257/784 |
| 2014/0306354 | A1 * | 10/2014 | Shin | H01L 24/06 257/777 |
| 2015/0069577 | A1 * | 3/2015 | Hart | H01L 29/02 257/620 |
| 2015/0089457 | A1 * | 3/2015 | Agarwal | G03F 7/70466 716/52 |
| 2015/0206849 | A1 * | 7/2015 | Rong | H01L 25/0655 257/777 |
| 2016/0071829 | A1 * | 3/2016 | Yu | H01L 25/16 257/773 |
| 2016/0172345 | A1 * | 6/2016 | Chen | H01L 24/16 257/777 |
| 2017/0084517 | A1 * | 3/2017 | Carney | H01L 21/76898 |
| 2018/0068980 | A1 * | 3/2018 | Clegg | H01L 21/6835 |
| 2019/0027466 | A1 * | 1/2019 | Fricker | H01L 21/4889 |
| 2019/0057953 | A1 * | 2/2019 | Fricker | H01L 23/5386 |
| 2019/0074262 | A1 * | 3/2019 | Fricker | H01L 23/562 |
| 2019/0157243 | A1 * | 5/2019 | Fricker | H01L 23/564 |
| 2019/0302942 | A1 * | 10/2019 | Kim | G06F 3/0448 |
| 2020/0006252 | A1 * | 1/2020 | Yu | H01L 23/4006 |
| 2020/0020659 | A1 * | 1/2020 | Fricker | H01L 24/83 |
| 2020/0051890 | A1 * | 2/2020 | Fricker | H01L 23/3735 |

* cited by examiner

200

Providing a Semiconductor Substrate S210

Identifying a Largest Square S215

Fabricating Circuitry Layers S220

Providing Self-Correcting Mechanisms S222

Providing a Protective Barrier S225

Fabricating Inter-Die Connections S230

Semiconductor Substrate Reduction S240

Implementing a First Fabrication of a 1st Connection Type S1210

Testing Characteristics of Semiconductor S1220

Implementing a Second Fabrication of a 2nd Connection Type S1230

Reducing the Semiconductor S1240

SYSTEMS AND METHODS FOR HIERARCHICAL EXPOSURE OF AN INTEGRATED CIRCUIT HAVING MULTIPLE INTERCONNECTED DIE

CROSS-REFERENCE TO RELATED APPLICATIONS

This application claims the benefit of U.S. Provisional Application No. 62/782,826, 20 Dec. 2018, which is incorporated in its entirety by this reference.

TECHNICAL FIELD

The inventions described herein relate generally to the integrated circuit architecture and fabrication fields, and more specifically to a new and useful integrated circuit architecture and integrated circuit manufacturing methods in the integrated circuit architecture field.

BACKGROUND

While the concept of artificial intelligence has been explored for some time, the modern applications of artificial intelligence have exploded such that artificial intelligence is being integrated into many devices and decision-making models to improve their learning, reasoning, data processing capabilities, and the like of the devices. The most apparent and broad applications of artificial intelligence include machine learning, natural language processing, computer vision, robotics, knowledge reasoning, planning, and general artificial intelligence.

To be effective, many of the above-noted broad applications of artificial intelligence require the consumption of extremely large data sets in the initial training of the artificial intelligence algorithms (e.g., deep learning algorithms, recurrent neural networks algorithms, etc.) being implemented in the specific applications and/or devices (e.g., autonomous vehicles, medical diagnostics, etc.). Because the data sets used in training are often very large and the underlying computer architecture may not be specifically designed for artificial intelligence training, the training of an artificial intelligence algorithm may require thousands of hours of data processing by the underlying computer architecture. While it may be possible to scale or increase the number of computers or servers used in ingesting data sets for training an artificial intelligence algorithm, this course of action often proves to not be economically feasible.

Similar data processing issues arise in the implementation or execution of the artificial intelligence algorithms due to the large amount of data being captured such as data originating from billions of Internet transactions, remote sensors for computer vision, and the like. The modern remote distributed networked servers (e.g., the cloud) and onboard computer processors (e.g., GPUs, CPUs, etc.) appear to be inadequate for ingesting and processing such great volumes of data efficiently to maintain pace with the various implementations of the artificial intelligence algorithms.

Accordingly, there is a need in the semiconductor space and specifically in the computer chip architecture field for an advanced computing processor, computing server, or the like that is capable of rapidly and efficiently ingesting large volumes of data for at least the purposes of allowing enhanced artificial intelligence algorithms and machine learning models to be implemented. Additionally, these advanced computing systems may function to enable improved data processing techniques and related or similar complex and processor-intensive computing to be achieved.

The inventors of the inventions described in the present application have designed an integrated circuit architecture that allows for enhanced data processing capabilities and have further discovered related methods and architectures for fabricating the integrated circuit(s), packaging the integrated circuit(s), powering/cooling the integrated circuit(s), and the like.

The below-described embodiments of the present application provide such advanced and improved computer chip architecture and related IC fabrication techniques.

BRIEF SUMMARY OF THE INVENTION(S)

In one embodiment, a method for fabricating distinct types of circuit connections on a semiconductor wafer includes fabricating, using a first photomask, a plurality of a first type of circuit connections for each of a plurality of distinct die of a semiconductor wafer; and fabricating, using a second photomask, a plurality of a second type of circuit connections between a plurality of distinct pairs of components of the semiconductor wafer, wherein each distinct pair of components includes at least one distinct die of the plurality of distinct die and one of a conductive pad and a sacrificial die.

In one embodiment, the fabrication using the first photomask includes: performing a single-shot exposure of the first photomask to create at a same time the plurality of the first type of circuit connections between a plurality of distinct pairs of the plurality of distinct die of the semiconductor wafer.

In one embodiment, the fabrication using the first photomask includes: performing a single-shot exposure of the first photomask to create at a same time the plurality of the first type of circuit connections within each of the plurality of distinct die of the semiconductor wafer.

In one embodiment, the fabrication using the second photomask includes: performing a single-shot exposure of the second photomask to create at a same time the plurality of the second type of circuit connections between each of the plurality of distinct pairs of components.

In one embodiment, the first photomask includes a plurality of distinct circuit connection patterns, wherein each one of the plurality of distinct circuit connection patterns corresponds to one of the plurality of distinct die of the semiconductor wafer; the fabrication using the first photomask includes: arranging the first photomask over all the plurality of distinct die of the semiconductor wafer, exposing the first photomask and transferring at a same time each one of the plurality of distinct circuit connection patterns to a respective one of the plurality of distinct die of the semiconductor wafer.

In one embodiment, the second photomask includes a plurality of distinct circuit connection patterns along at least one peripheral boundary of the second photomask, wherein each one of the plurality of distinct circuit connection patterns corresponds to one of the plurality of distinct pairs of components of the semiconductor wafer; the fabrication using the first photomask includes: arranging the second photomask over a peripheral region of the semiconductor wafer, exposing the second photomask and transferring at a same time each one of the plurality of distinct circuit connection patterns to a respective one of the plurality of distinct pairs of components of the semiconductor wafer.

In one embodiment, the plurality of distinct die of the semiconductor wafer include a first column of die along a first peripheral boundary of the semiconductor wafer and a second column of die along a second peripheral boundary of the semiconductor wafer; the second photomask include: a first circuit connection pattern for a first plurality of the second type of circuit connections along a first peripheral border of the second photomask; a second circuit connection pattern for a second plurality of the second type of circuit connections along a second peripheral border of the second photomask; the fabrication using the second photomask includes: arranging the second photomask over the first column of die and the second column of die of the semiconductor wafer, exposing the second photomask and transferring at a same time the first circuit connection pattern and the second circuit connection pattern, respectively, to the first column of die and the second column of die of the semiconductor wafer.

In one embodiment, the plurality of the first type of circuit connections the first photomask include: a first circuit connection pattern for fabricating intra-die circuit connections within each one of the plurality of distinct die of the semiconductor wafer; and a second circuit connection pattern for fabricating inter-die circuit connections between distinct pairs of the plurality of distinct die of the semiconductor wafer.

In one embodiment, the fabrication using the first photomask of the plurality of first type of circuit connections includes: implementing a single exposure of the first photomask that transfers at a same time the first circuit connection pattern and the second circuit connection pattern to the plurality of distinct die of the semiconductor wafer.

In one embodiment, the method includes exposing the first photomask that provides the plurality of the first type of circuit connections; and subsequently, exposing the second photomask that provides the plurality of the second type of circuit connections, wherein the plurality of the first type of circuit connections are distinct from the plurality of the second type of circuit connections.

In one embodiment, the method includes subsequent to the fabrication of the plurality of the first type of circuit connections and before the fabrication of the plurality of the second type of circuit connections, performing a circuit testing of the plurality of distinct die of the semiconductor wafer prior to the fabrication of the plurality of second type of circuit connections, wherein the circuit testing includes: measuring a number of functioning die of the plurality of distinct die of the semiconductor wafer, and computing a functional die yield based on the number of functioning die.

In one embodiment, the fabrication of the plurality of the second type of circuit connections is based the functional die yield satisfying or exceeding a yield threshold.

In one embodiment, the plurality of the first type of circuit connections the first photomask include a circuit connection pattern for fabricating inter-die circuit connections between distinct pairs of the plurality of distinct die of the semiconductor wafer, wherein the inter-die circuit connections communicatively connect distinct pairs of die; the fabrication using the first photomask includes exposing the first photomask over the plurality of distinct die while the semiconductor wafer is in an un-diced state, wherein in the un-diced state each distinct die of the plurality of die are connected via a material of the semiconductor wafer and are not individually severed.

In one embodiment, the method includes reducing a size of the semiconductor wafer based on a completion of the fabrication of the plurality of the first type of circuit connections and the fabrication of the plurality of the second type of circuit connections.

In one embodiment, reducing the size of the semiconductor wafer includes severing excess material from the semiconductor wafer by cutting through a column of die of the plurality of distinct die of the semiconductor wafer.

In one embodiment, fabricating the plurality of the second type of circuit connections includes: fabricating, at each distinct pair of components, a circuit connection of the second type that extends from a first region of the semiconductor wafer having a plurality of active die and one or more second regions of the semiconductor wafer having a plurality of sacrificial die that support a coarse end of the circuit connection, wherein the plurality of sacrificial die include a plurality of inactive die arranged along one or more peripheral regions of the semiconductor wafer.

In one embodiment, the second photomask includes a distinct circuit connection design that enables a fabrication of circuit connections of the second type that extend between a first region of the semiconductor wafer that includes a plurality of active die and one or more second regions of the semiconductor wafer that include a plurality of inactive die that define a supporting substrate to one end of each circuit connection of the second type.

In one embodiment, the circuit connections of the second type comprise fan-out circuit connections, and the plurality of inactive die support the fan-out circuit connections.

In one embodiment, a circuit connection design of the first photomask produces granular circuit connections along the semiconductor wafer, a circuit connection design of the second photomask produces coarse circuit connections along the semiconductor wafer, and the coarse circuit connections produced by the second photomask are larger than the granular circuit connections of the first photomask.

In one embodiment, a method for fabricating circuits using a mixed exposure of reticles includes: arranging a first reticle over a plurality of die of a wafer, the first reticle including a first circuit pattern for each of the plurality of die of the wafer; implementing a single exposure of the first reticle that transfer the first circuit pattern to each of the plurality of die of the wafer; subsequently, arranging a second reticle over the plurality of die of the wafer, the second reticle including a second circuit pattern for a plurality of die along one or more peripheral regions of the wafer; and implementing a single exposure of the second reticle that transfers the second circuit pattern to each of the plurality of die along the one or more peripheral regions of the wafer.

BRIEF DESCRIPTION OF THE FIGURES

FIG. 2 illustrates a method 200 in accordance with one or more embodiments of the present application;

FIG. 9 illustrates a specific example of the schematic of a semiconductor substrate with masks forming connections which is shown in FIG. 8, illustrating a first and second circuit connection pattern along a first and second peripheral border, respectively, in accordance with one or more embodiments of the present application.

DESCRIPTION OF THE PREFERRED EMBODIMENTS

Figure 1:
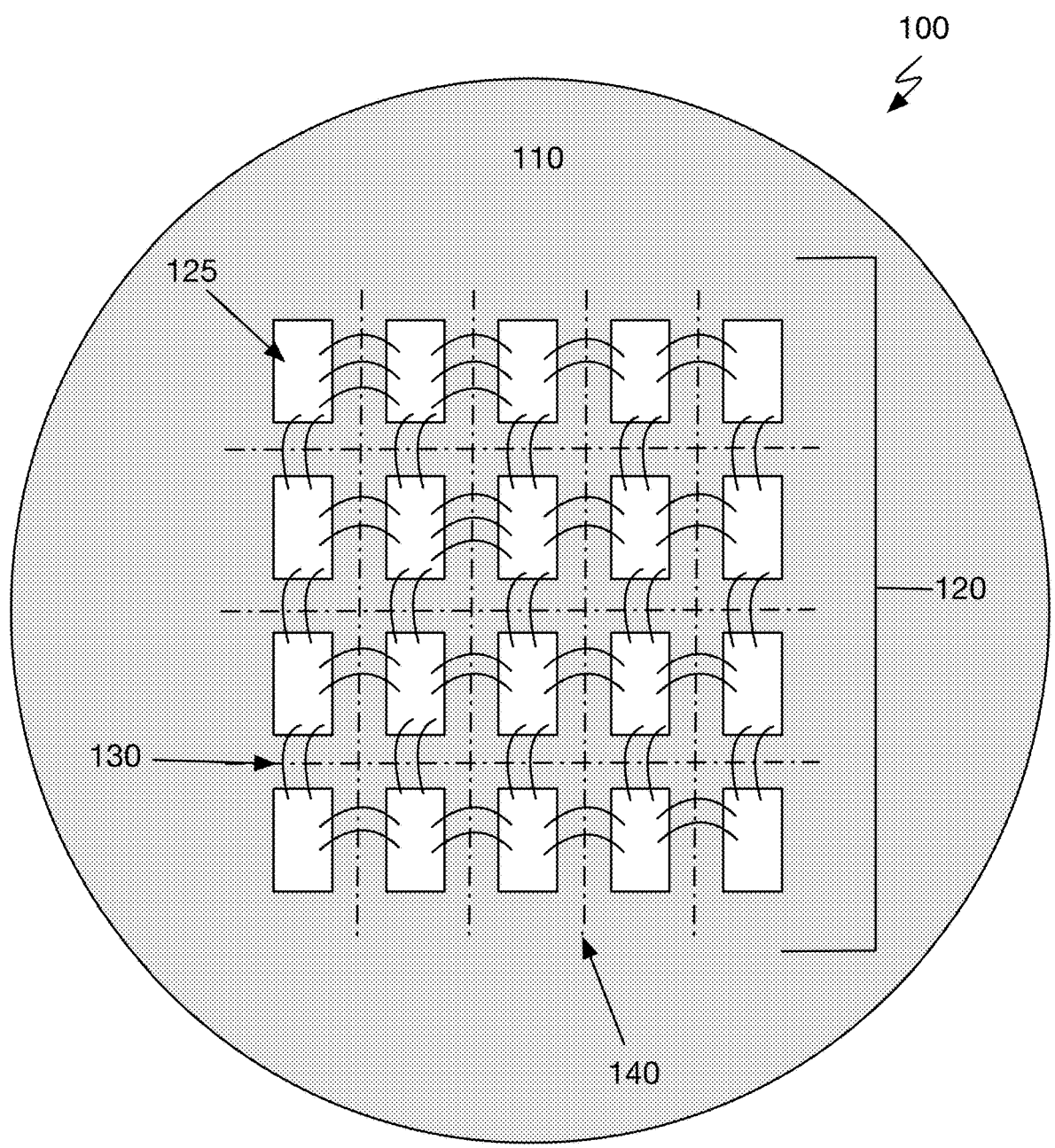
FIG. 1 illustrates a schematic of a system 100 in accordance with one or more embodiments of the present application.
Figure 3A:
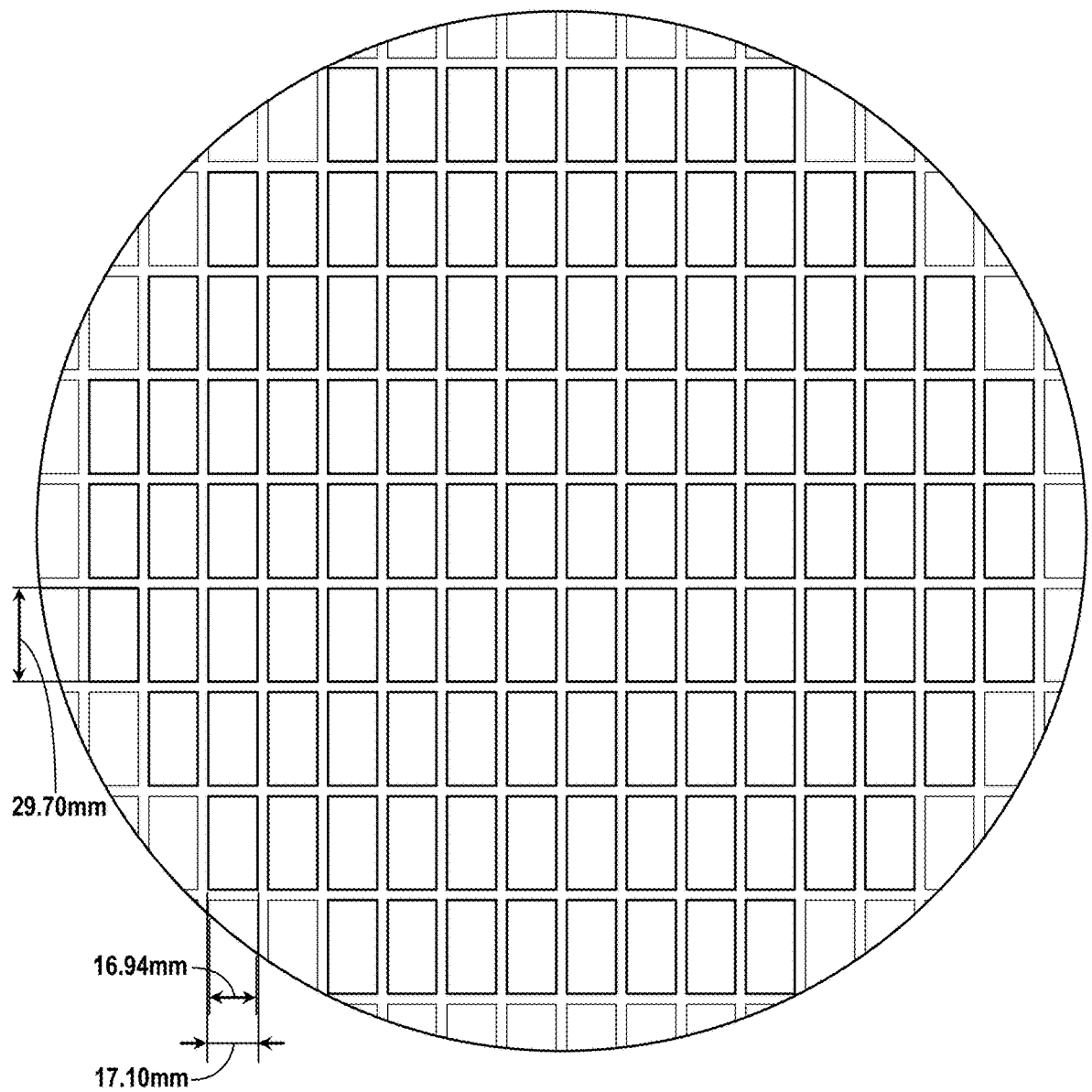
FIG. 3A-3D illustrate several schematics of a semiconductor substrate without and with interconnections in accordance with one or more embodiments of the present application.
Figure 3B:
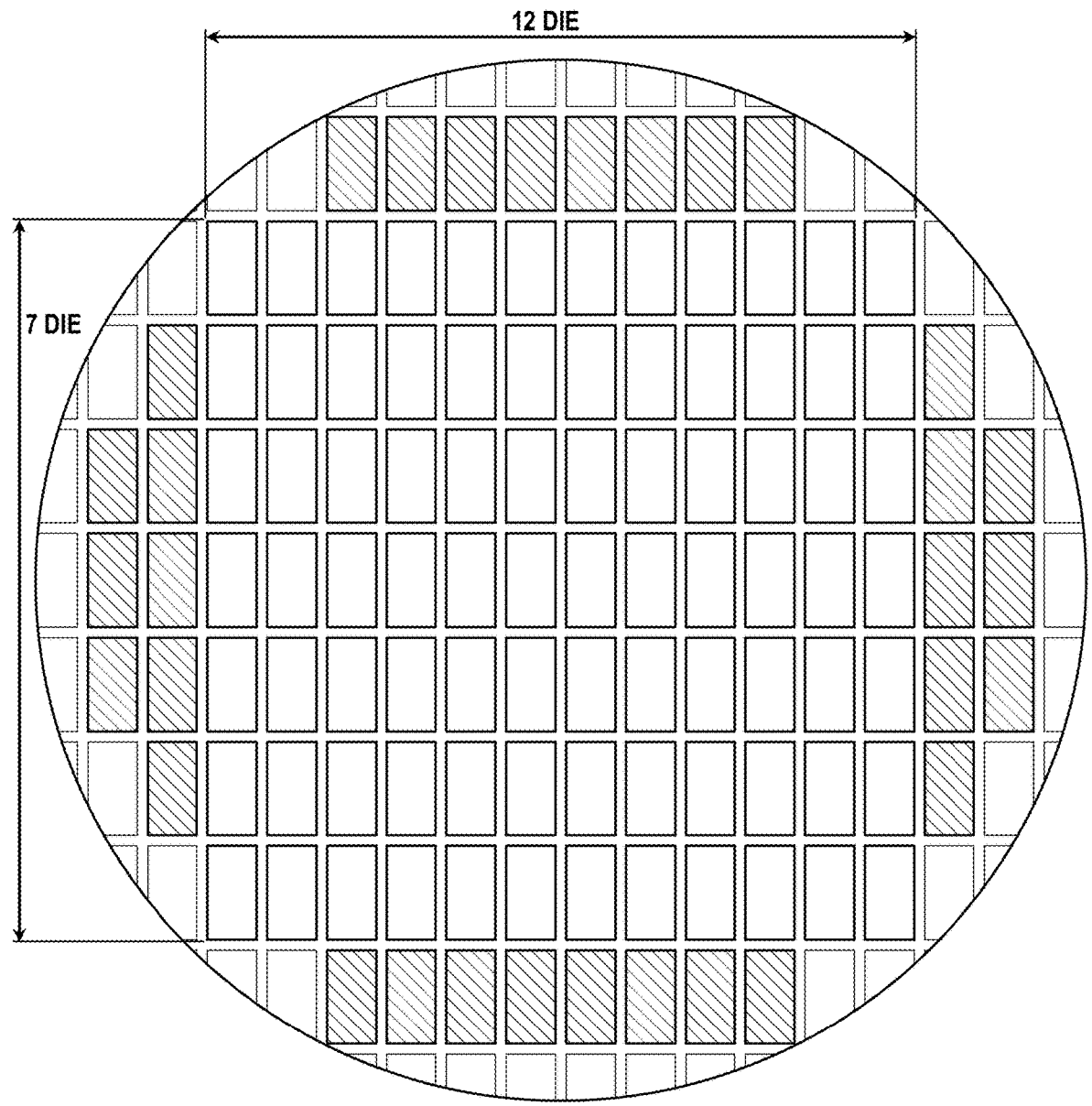
Figure 3C:
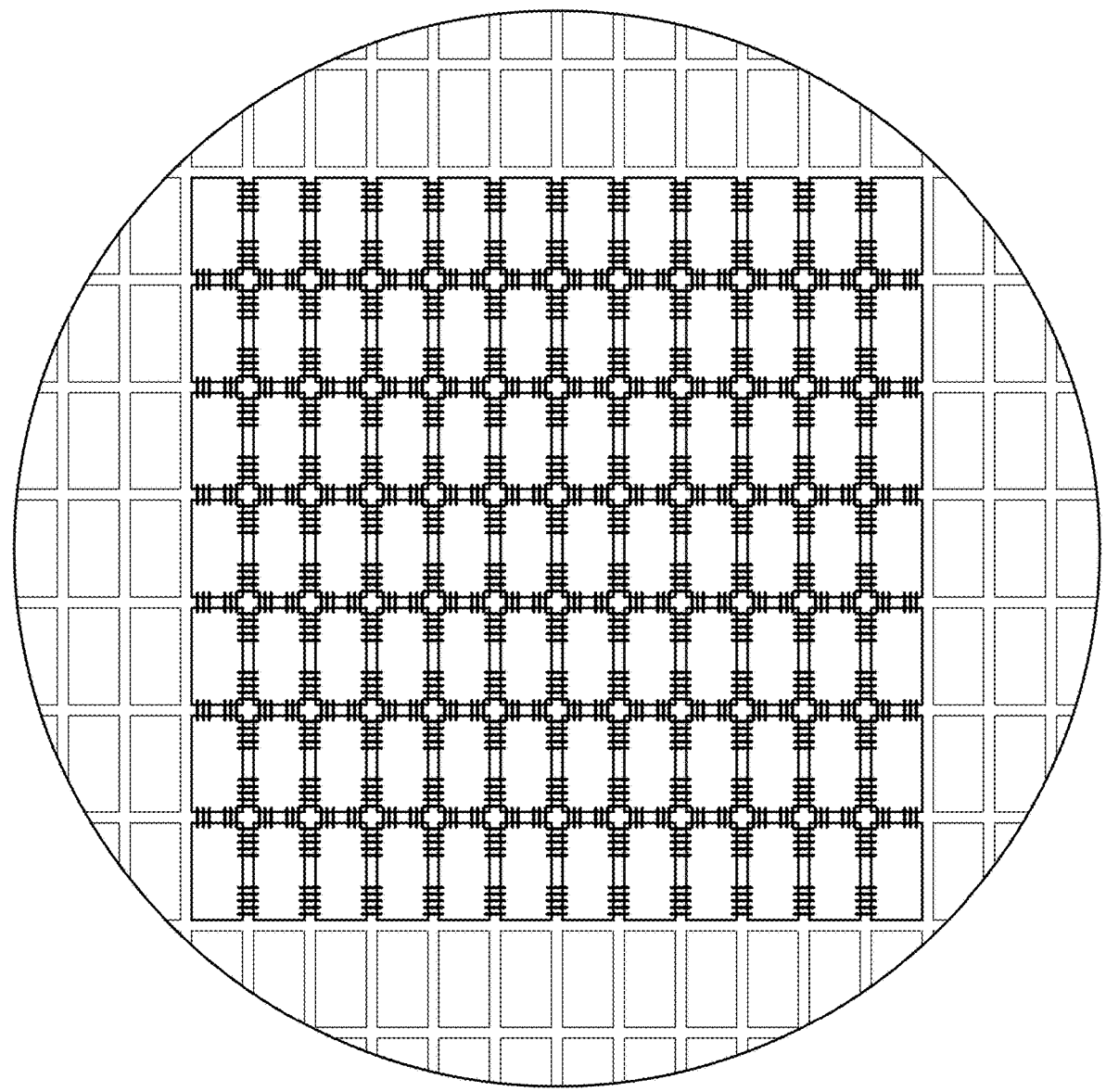
Figure 3D:
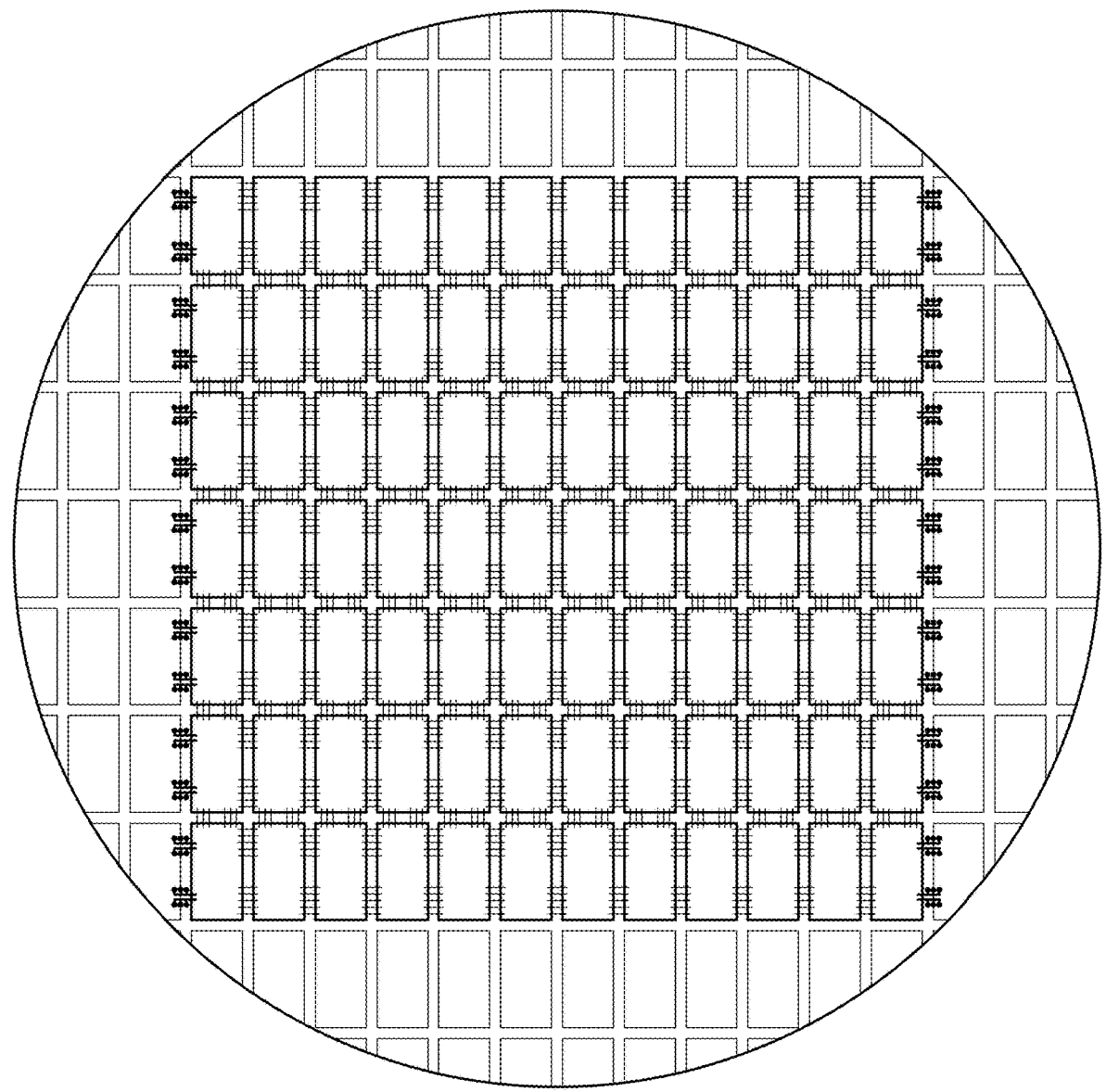
Figure 4A:
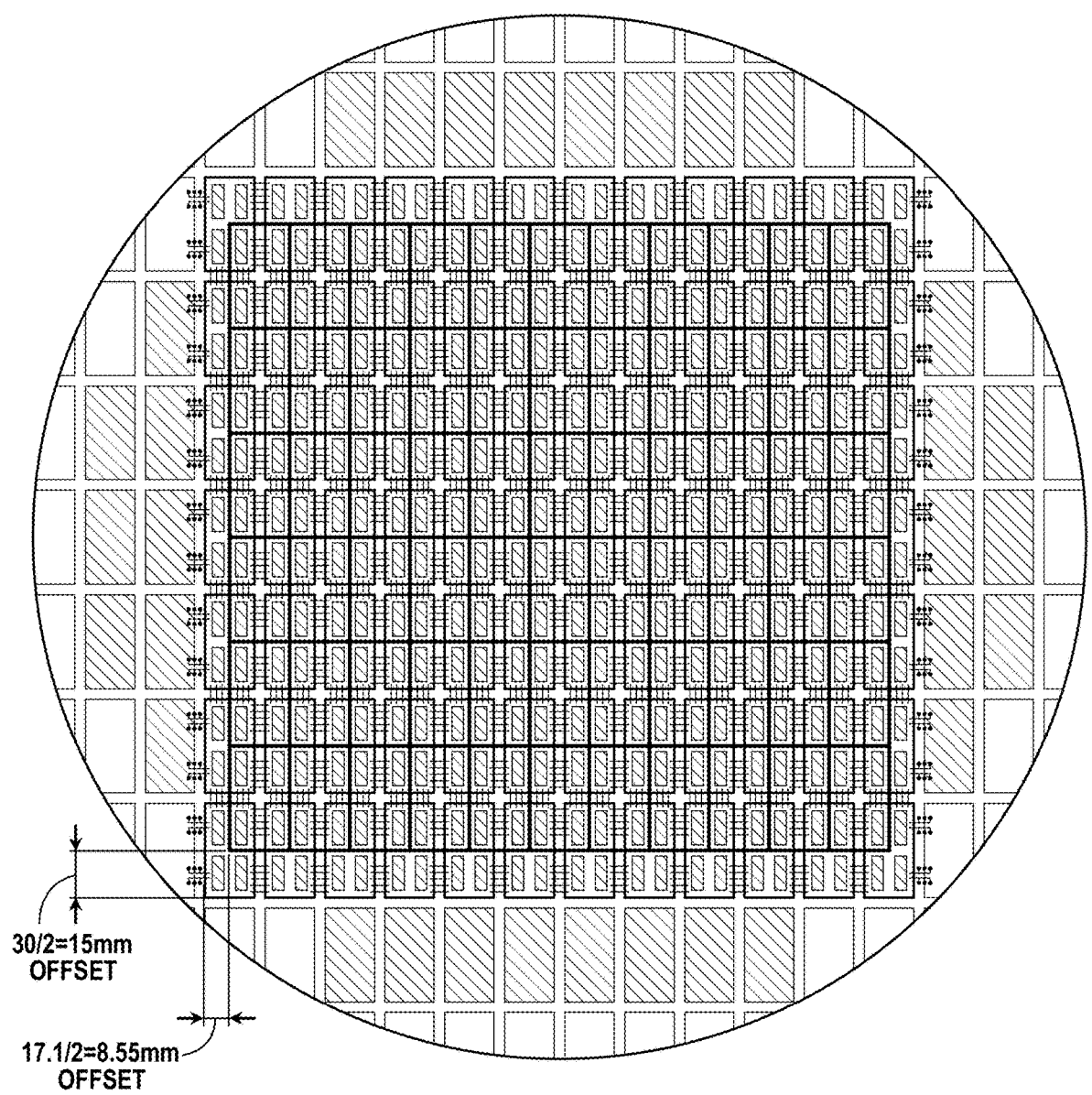
FIG. 4A-4D illustrate several schematics of a semiconductor substrate during exposure processes and size reduction in accordance with one or more embodiments of the present application.
Figure 4B:
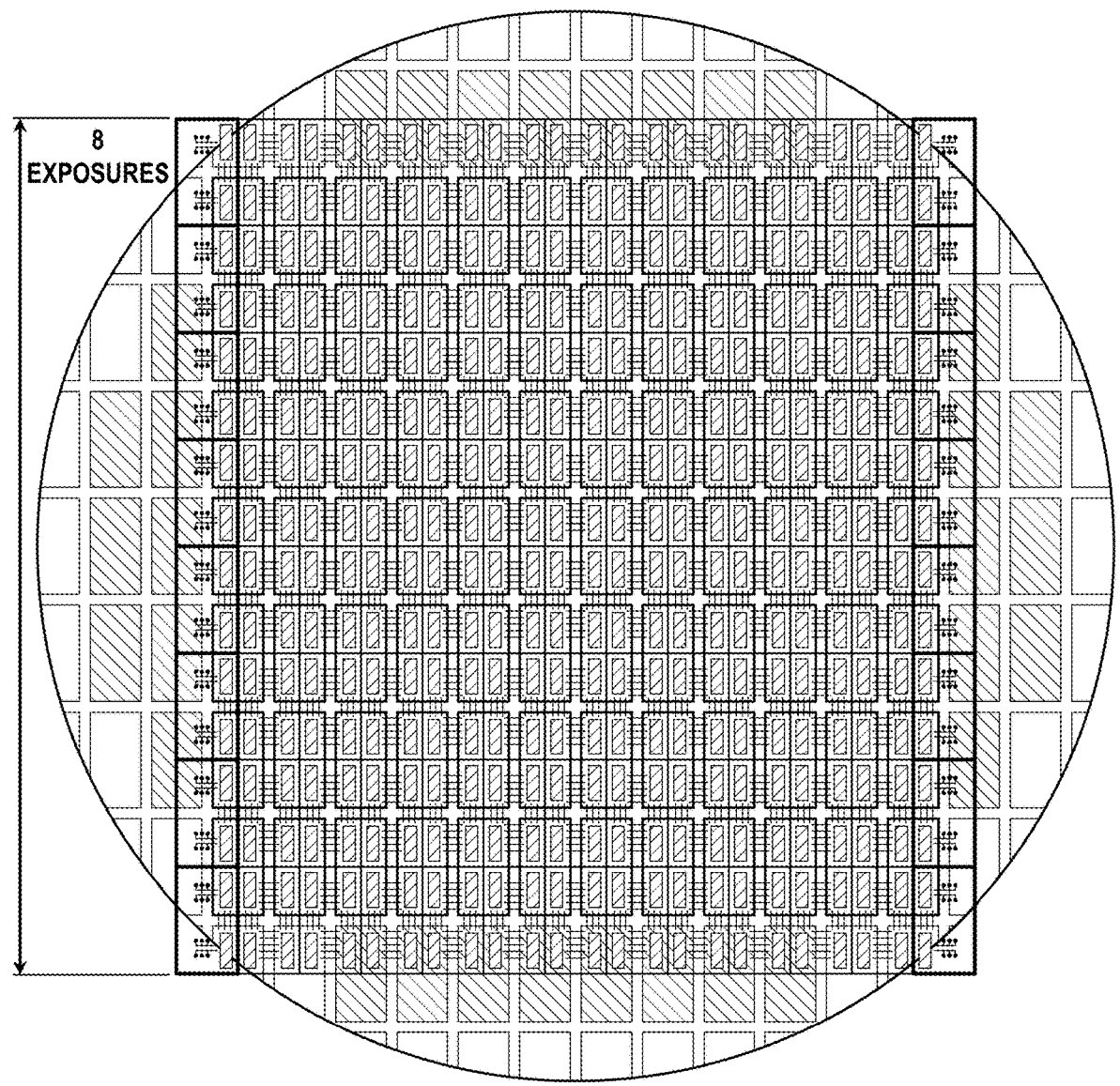
Figure 4C:
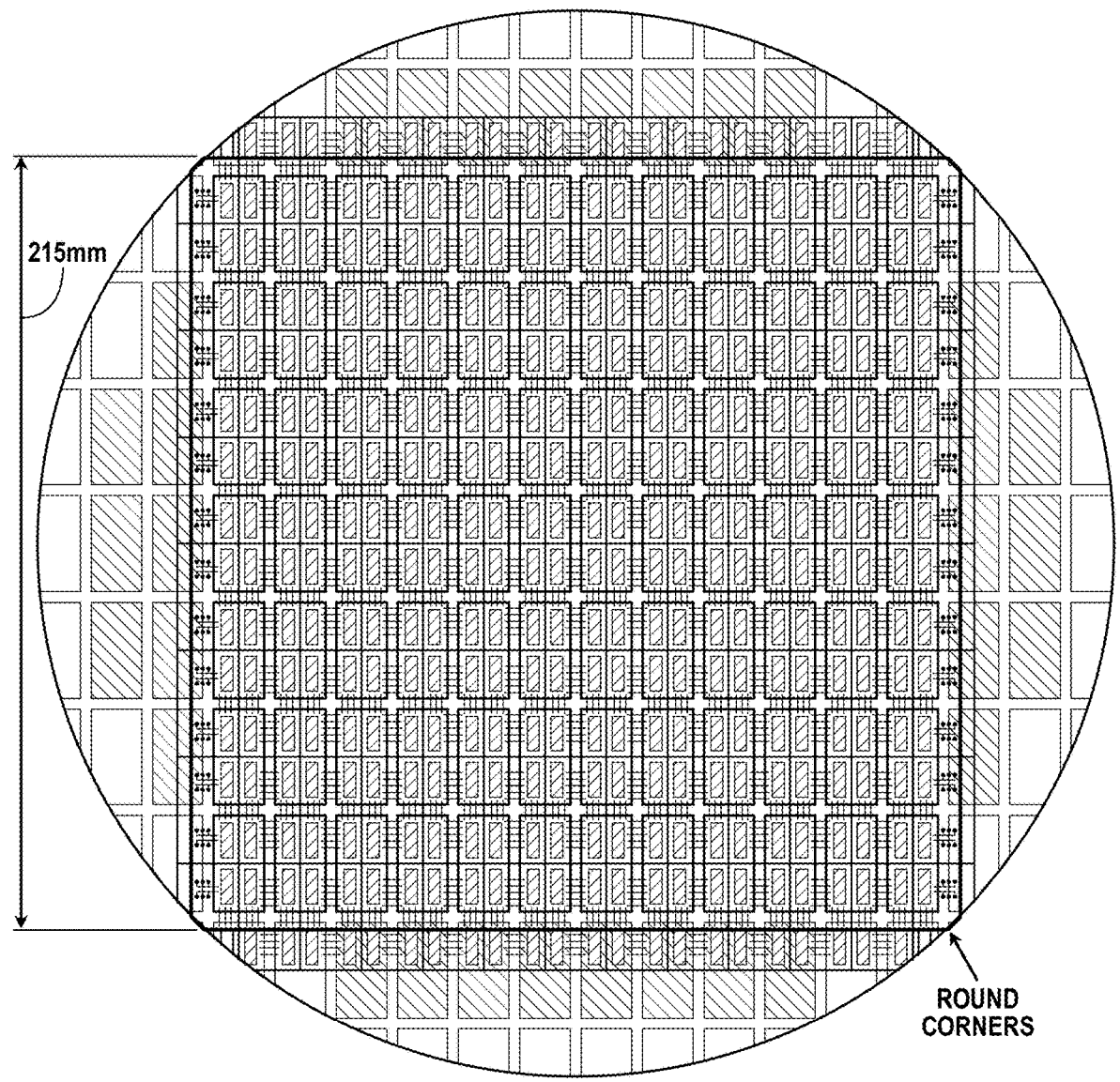
Figure 4D:
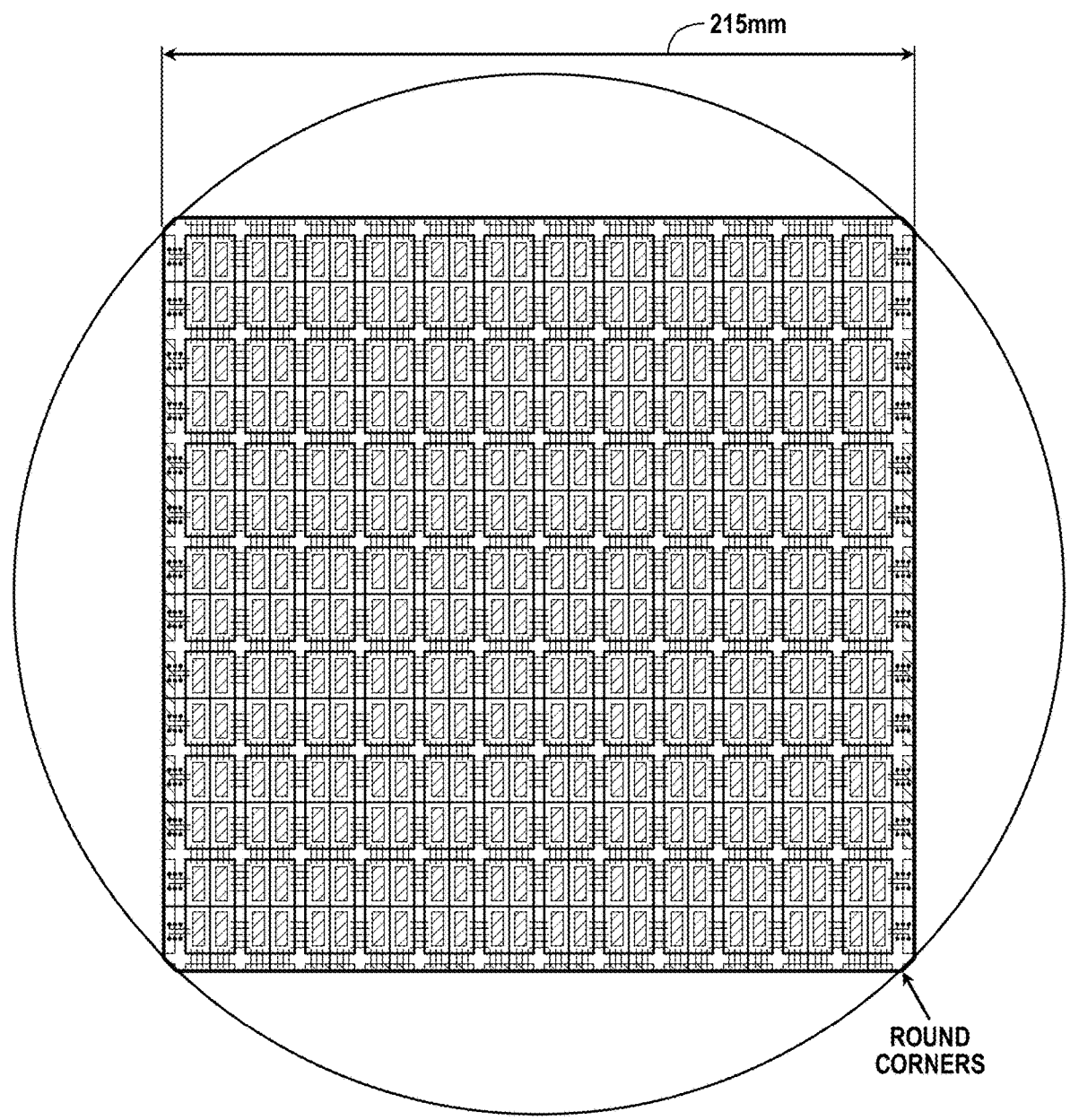

The following description of preferred embodiments of the present application are not intended to limit the inventions to these preferred embodiments, but rather to enable any person skilled in the art of to make and use these inventions.

1. Overview
1.1 Die Connectivity

Traditional integrated circuit manufacturers may prepare a single silicon wafer with many die formed on the silicon wafer. Once each die is formed on the silicon wafer, the integrated circuit manufacturer may then separate each die on the silicon wafer by physically cutting the wafer and having each die separately packaged into a chip. In some cases, the manufacturer may install several of those disparate or separate chips onto a same printed circuit board (PCB) to form an assembly and provide connections between the disparate chips so that they may communicate across the PCB assembly. The communication connections between the chips may typically be found in the PCB. However, when a multi-chip PCB is manufactured in this manner, the communication between disparate chips thereon becomes limited by the amount connectivity or bandwidth available in each connection between the disparate chips because the chips are in indirect communication via the PCB. The bandwidth across chips (e.g., off-chip communication) formed on separate pieces of silicon may be multiple orders of magnitude lower compared to chips that remain and communicate on a same piece of silicon or die.

The embodiments of the present application provide technical solutions that resolve connectivity, communication, and bandwidth issues of traditional integrated circuits and mainly, arising from integrated circuits manufactured on separate pieces of silicon (e.g., off-die integrated circuits). The technical solutions of the embodiments of the present application enable multiple die to be maintained on a same or single substrate (e.g., a wafer) without partitioning away each die in a wafer cutting process and further, while also establishing direct communication connectivity between adjacent die on the single substrate. Accordingly, the embodiments of the present application function to provide die-to-die connectivity on a single substrate or wafer.

The resulting substrate, however, has multiple die and consequently becomes a very large computer chip. Therefore, several technical problems relating to operational yield of the die on the large chip, packaging of the large chip, and powering/cooling of the large chip must also be solved. U.S. Patent Application Ser. No. 62/536,063, which is incorporated by reference herein in its entirety describes technical solutions to these related technical problems.

1.2 Packaging and Coefficient of Thermal Expansion Mismatch

As alluded to in section 1.1, the fabrication of multiple die on a single substrate or wafer produces a very large die or resulting computer chip. While the connectivity of the multiple die to form a single large die on a single substrate and improved bandwidth across the substrate may be achieved according to the technical solutions described in U.S. Patent Application Ser. No. 62/536,063, the very large size of the resulting die then gives rise to many technical issues at the system level when packaging the very large die to a PCB, panel, or an organic substrate.

The embodiments of the present application, therefore, also provide a system and method for enabling large silicon die, like those described in section 1.1 and beyond, to be used in PCBs or organic substrates having a non-compliant coefficient of thermal expansion relative to the large silicon die.

The technical problem of CTE mismatch arises in the computer chip packaging process results from a difference in the CTE of silicon onto which an integrated circuit is fabricated and the CTE of the substrate (e.g., PCB) onto which the silicon is later attached. The mismatch in CTEs of the silicon and the PCB onto which the silicon is attached results in the expansion (when powered or heat applied) of the two materials at different rates, inducing mechanical stresses, which can lead to damage in the computer chip, usually while in use. In traditional chip packaging, it is only a single silicon die with circuitry that is attached to a PCB at a time and the relatively small size of the single silicon die may produce a small or negligible expansion mismatch with the PCB that the single silicon die is attached to. For instance, to attach a single silicon die to a PCB, small microbumps are added to a surface of the single silicon die then the silicon die is affixed to the PCB. When the single silicon die and the PCB expand at different rates due to differences in CTE properties of the materials, the microbumps can typically elastically deform and absorb the small shearing forces produced by the different expansions of the PCB and the silicon die. By contrast, when the silicon die is very large (e.g., includes multiple die), the microbumps are not capable of managing the large differences in expansion of the large silicon die and the PCB and thus, the microbumps will become damaged or cracked due to the excessive displacement of the silicon die relative to the PCB.

Additionally, in the case of a small silicon die, the PCB material may be selected such that the disparity between the CTE of the silicon die and the CTE of the PCB are reduced sufficiently for compatibility.

However, the large size of the silicon die of several embodiments of the present application exacerbates the problem of CTE mismatch. In some instances, the large silicon die described herein may be up to eighty or more times larger than a single silicon die and thus, the expansion of such a large silicon die may be compounded and the resulting expansion mismatch with a PCB onto which the large silicon die is attached is similarly compounded. Additionally, because the large silicon die may be so great, there are currently no materials that may be selected and combined to form a PCB and achieve CTE compatibility with the CTE of the large silicon die.

To address at least these technical problems, embodiments of the present application provide an elastomeric connector that is disposed between the large silicon die and a PCB or other substrate. The elastomeric connector may be capable of conducting a signal through it while placed under pressure of the system and may also be malleable. The malleability of the elastomeric connector allows for absorption of the shearing displacement between the large silicon die and the PCB. U.S. Patent Application Ser. No. 62/536,071, which is incorporated by reference herein in its entirety describes technical solutions to these related technical problems.

1.3 Substrate Securing Mechanism

As introduced in section 1.2, a large elastomeric connector may be preferable for establishing a connection between a large wafer and a corresponding PCB (or panel). Specifically, one embodiment of the described elastomeric connector includes a large piece of silicon rubber that is malleable and having a plurality of conductive elements (e.g., conductive contacts) therein. The plurality of conductive elements in the elastomeric connector preferably contacts both the PCB and the wafer when the system when placed under a compression load thereby establishing signal connectivity between the PCB and the wafer.

The compression of the combination of the wafer, the elastomeric connector, and the PCB is preferably achieved over a large surface of the compression system; however, because the wafer is thin and may be composed of relatively delicate material, the application of the compression forces for establishing the signal connectivity and also, to secure together the wafer, the elastomeric connector, and the PCB must be carefully applied during assembly and further, maintained after the assembly of the integrated circuit. At least a uniform compression system is proposed by the embodiments of the present application to achieve a required overall system compression after assembly.

In related art or traditional assembly systems, there exist no such system designed for achieving this technical uniform compression. Rather, in traditional IC assemblies, a CPU is assembled to the motherboard by placing the CPU in a socket of the motherboard. Afterward, a large clamping structure may be used to apply a clamping force to maintain the position of the CPU within the motherboard and four screws and springs may be applied to secure the CPU to the motherboard around the periphery of the CPU. This traditional process is typically done under compression but the compression is only over particular surfaces of the motherboard and CPU system. A backing plate usually composed of a strong material, such as steel (or other strong metal), may be affixed to one side of the motherboard (or PCB) because as the system is clamped, the clamping forces generate large opposing compression forces onto specific sections of the IC assembly that causes the motherboard to bow. Accordingly, to compensate for the flexibility of the motherboard, a steel backing plate having significant height or thickness may be added to the system to support or prevent the motherboard from bowing. The backing plate has to extend outside the periphery of the IC to reach and accommodate the compressing screws and springs. The backing plate has to be stiffened, and therefore thickened, as the span of compressing screws is extended and/or as the IC size, and therefore IC perimeter, is increased. The backing plate, therefore, tends to add significant weight and size to the overall structure of the IC because of the thickness and frame width around the IC of the backing plate that is required to resist the clamping forces.

In the embodiments of the present application, because the wafer, elastomeric connector, and PCB are large, significant compression forces (e.g., up to 4 tons or more of compression) may be required to achieve proper assembly and maintained system compression. If a backing plate, as used in the traditional systems were implemented, the backing plate would bow greatly and thus, a significantly larger backing plate having double or more thickness in size than a traditional backing plate would be required to prevent the PCB and IC assembly from bowing. In addition to grossly overweighting the system and increasing the size of the system (e.g., height and area) of the system, such a large backing plate would make it difficult to power the integrated circuit as it would be difficult to provide a power supply structure through such a thick backing plate.

To address at least these technical problems, embodiments of the present application provide an assembly system that provides a substantially uniform compression force across the system (without introducing an overly thick backing plate), during an assembly step, and that further enables a continued uniform compression of the system after assembly of the integrated circuit that ameliorates the tensile forces acting on the PCB, that reduces the size and weight of the overall system, and that enables sufficient or ease of access to power the integrated circuit.

1.4 Precise Fabrication of Orifices

In traditional methods for fabricating a hole in a semiconductor, lasers or other mechanical boring systems may be employed for fabricating the hole during a manufacturing of the semiconductor. The traditional methods while useful, in some circumstances, for fabricating holes in standard semiconductors, these traditional methods would fail to produce holes in a large semiconductor substrate (as described herein) with high precision and without irreparably damaging the semiconductor substrate.

In particular, to support an elastomeric connection between a large semiconductor substrate (large wafer) with multiple interconnected die and a substrate (e.g., PCB or the like), the large semiconductor substrate may be required to supply a uniform compression across an entire surface area thereof during a securing process. In several embodiments of the present application, the uniformity requirement may be achieved with a series of mechanical fasteners arranged across a surface area of the large semiconductor wafer and a wafer clamping system to uniformly apply the mechanical fasteners within the large semiconductor substrate.

Accordingly, the mechanical fastening requirement for securing the large semiconductor wafer and the substrate necessitated a further requirement to fabricate or drill holes through the large semiconductor substrate and the substrate sufficient to arrange the mechanical fastening elements. However, none of the traditional methods for fabricating a hole provide a technique that would prevent damage when drilling or fabricating a hole through a plurality of differential materials. For instance, while in many circumstances, a laser may be sufficiently precise for fabricating a whole in some materials, such as metal, the heat and intensity of a laser or drilling may damage in materials like silicon including propagating severe cracks or the like along the silicon material.

To address at least these technical problems, the embodiments of the present application provide systems and methods that enable a fabrication of a plurality of precise orifices arranged along a surface of a large semiconductor without damaging a silicon component of the semiconductor substrate.

1.5 Hierarchical Exposure of an Integrated Circuit

In fabricating the several distinct connections of a multi-die interconnected wafer, a fabrication process may include at least fabricating the inter-reticle or inter-die connections preferably with one or more first masks that are exposed and that can be recycled or reused along the wafer to achieve many, if not all, of the required inter-die or inter-reticle connections. The same one or more first masks typically cannot be used to achieve the often-required additional connections, such as input/output connections and/or any suitable peripheral connections, along one or more edges of the wafer because of the coarse pitches that may be associated with such peripheral connections. That is, the one or more first masks are typically designed with granular or finer pitches for fabricating finer or smaller-sized inter-die connections, whereas the peripheral connections that enable a connection of the wafer to external devices require coarse and/or larger connections. Therefore, the fabrication of the several connections (described above) required for enabling a suitable multi-die interconnected wafer traditionally requires multiple disparate masks and a process with multiple exposures for achieving the several distinctly sized connections along the wafer.

To address at least these technical problems, the embodiments of the present application provide systems and methods that enable a fabrication of a plurality of distinct connection types along a wafer with a limited number or a single mask thereby eliminating a need for varying types of masks and multiple exposures for achieving each of the plurality of distinct connection types of a wafer.

2. An IC with Inter-Die Connections and an Elastomeric Connector Assembly 2.1 IC with Inter-Die Connections As shown in FIG. 1, a semiconductor 100 illustrates an example integrated circuit having a substrate 110, a plurality of die 120 formed with the substrate no, a circuit layer 125, a plurality of inter-die connections 130, and scribe lines 140.

The semiconductor 100 may be manufactured using any suitable lithography system that is configured to implement the one or more steps of the methods described herein, including method 200.

The semiconductor 100 functions to enable inter-die communications between the plurality of die 120 formed with the single substrate no. The inter-die connections 130 formed between adjacent die on the substrate no improves communication bandwidth and enables a reduction in communication latency between connected die on the substrate no because communication between each of the plurality of die 120 is maintained on a same large die (e.g., on-die communication). That is, the inter-die connections 130 formed between the plurality of die 120 effectively eliminate a need to for a first die of the plurality of die 120 to go off-die (which increases latency due to transmission of signals using an intermediate off-die circuit) to establish communication with a second die of the plurality of die 120 since the first and the second die may be directly connected with one or more inter-die connections or, at a minimum, indirectly connected via intermediate inter-die connections established between one or more die between the first and the second die. Such configuration(s), therefore, enabling increasingly faster communications and data processing between die when compared, at least, to communications between die not maintained on a same substrate (e.g., a same wafer). Each of the plurality of die 120 remain on the single substrate 110 and are not cut from the substrate 110 into individual dice for separate packaging into an individual computer chip. Rather, at formation, only excess die (e.g., die that are not provided with circuitry or inactive die) along a periphery of the substrate 110 are preferably removed from the substrate 110 and the remaining portions of the substrate 110 having the plurality of die 120 (e.g., active die) may form a predetermined shape (e.g., a rectangular shape) with the substrate 110. The resultant substrate 110 after being reduced to shed excess die and potentially following one or more additional refinement or IC production processes may then be packaged onto a board (e.g., a printed circuit board (PCB) or an organic substrate).

The substrate 110 is preferably a wafer or a panel into and/or onto which die having a circuitry layer 125 on which microelectronic devices may be built. The circuitry layer typically defines one or more surfaces on a die onto which circuits and various microelectronic devices may be fabricated using a lithography system. The substrate 110 is preferably formed of a silicon material (e.g., pure silicon), but may be additionally or alternatively formed of any suitable material including silicon dioxide, aluminum oxide, sapphire, germanium, gallium arsenide, an alloy of silicon and germanium, indium phosphide, and the like. The substrate 110 may be a virgin wafer. Alternatively, the substrate 110 may include one or more layers formed therein where the one or more layers may include, but not limited to, a photoresist, a dielectric material, and a conductive material. The photoresist being light-sensitive material may include any material that may be patterned by a lithography system. The photoresist may be positive photoresist or negative photoresist.

Accordingly, the substrate 110 may be formed of any thin slice of semiconductor material that may be used for fabrication of integrated circuits having varying diameters and shapes, but preferably the substrate 110 is formed in a circular shape and with a diameter of 300 mm.

The lithography system may refer to any lithography system that prints images of a reticle onto a substrate (e.g., a wafer) using light. The lithography system may be a scanning projection system or a step and scan system, which may be alternatively referred to as a scanner or a stepper. The lithography system may include any suitable exposure system including one or more of optical lithography, e-beam lithography, X-ray lithography, and the like.

The microelectronic devices, such as transistors, diodes, various circuits, and the like may be formed into and/or over the substrate 110 using lithographic processes (e.g., optical lithography, etc.).

Each of the plurality of die 120 may be a block of semiconducting material on which circuits may be fabricated. Each of the plurality of die 120 may be formed by an exposure process of silicon material of or on the substrate 110 and typically in a rectangular shape or square shape. However, it shall be noted that the die 120 may take on any suitable form including any geometric and non-geometric forms. Other than excess die that is removed from the substrate 110 during a substrate reduction process, the plurality of die 120 are not cut or diced from the substrate 110 into individual dice.

Additionally, each of the plurality of die 120 includes an alignment point preferably at a center of each die. The alignment point may be used by the stepper of the lithographic system to align the photomask and/or photoreticle with respect to each of the plurality of die 120 before an exposure process. Further, each of the plurality of die 120 may include a seal ring surrounding or covering a periphery (perimeter) of each of the die other than the circuitry layer (e.g., circuit fabrication surface) of each dice. Accordingly, the seal ring may be provided at the side surfaces of each dice which extend in a normal direction (i.e., perpendicular) with respect to the surface of the substrate no and further, located adjacent scribe lines 140. The seal ring functions to protect each dice from various contaminants or particulates that may potentially impregnate or enter a dice.

The plurality of inter-die connections 130 function to connect, at least, any two circuits (e.g., the inter-die connections may connect a transmitting circuit and receiving circuit of two die, respectively) between two die of the plurality of die 120 on the substrate no. That is, each inter-die connection 130 may be formed or provided to extend from a first dice to a second dice located on the substrate no. Preferably, an inter-die connection 130 may be formed between two adjacent die. Each inter-die connection may be formed of a material having a length and an endpoint at each respective end of the length of material (e.g., two endpoints), where each respective endpoint terminates at a circuitry layer of a different dice on the substrate no.

In the case that the die are formed in a rectangular or similar geometric or substantially geometric shape, the inter-die connections 130 may extend between two parallel or substantially parallel surfaces of the two-adjacent die. Accordingly, it is possible for a single dice of the plurality of die 120 to be connected to more than one dice depending on the positioning of the dice in the array of die on the substrate no. When positioned in an interior of the substrate no, the single dice of the plurality of die 120 may be adjacent to four other die having at least one surface that is parallel to one of the four side surfaces of the single dice where one or more inter-die connections 130 may be formed. It shall be understood that while in preferred embodiments it is described that the die may be formed as a rectangle (or other polygon), the die may be formed in any shape or manner suitable for preparing an integrated circuit including non-traditional, non-geometric or non-polygonal shapes.

The plurality of inter-die connections 130 (global wires) are preferably wires or traces that function to conduct signals across two die. The plurality of inter-die connections 130 are preferably formed of a same conductive material used to form intra-dice connections (or local wires) between circuit elements of a single dice. Additionally, or alternatively, the plurality of inter-die connections 130 may be formed of any suitable conductive material that may be the same or different from materials forming other wires on a dice or that may be the same or different from materials forming the circuits on the dice.

In a preferred embodiment, the plurality of inter-die connections 130 are formed by offsetting the stepper of a lithographic system a predetermined distance from a center or alignment point of a single dice sufficiently to allow an exposure to be performed for and between two adjacent die rather than an exposure focusing on the circuitry layer 125 of an individual dice. Consequently, the exposure(s) that provide the inter-die connections 130 may be formed over the scribe lines 140. Additionally, the endpoints of an inter-die connection 130 may be positioned or formed at interior position relative to a location of the seal ring of a dice. Accordingly, while the inter-die connections 130 may be formed at any suitable location between two die, the inter-die connections may be typically formed such that the respective endpoints of an inter-die connection 130 are positioned inwardly of the seal ring of the dice on which it terminates such that each respective endpoint of an inter-die connection 130 is positioned at some location between the seal ring and a center of the respective dice.

The scribe lines 140 (or saw street) function to indicate a location between two disparate die on the substrate 110 where the substrate 110 would typically be cut for forming individual dice. The scribe lines 140 may typically be centered between two or adjacent die and in many cases, have a width similar to a width of a saw used for cutting wafers and the like. In a typical circumstance, no circuitry or other elements would be formed on or over the scribe lines 140, as these elements would most likely be severed or damaged during a cutting process of the substrate no.

As shown in FIG. 2, a method 200 for producing a large semiconductor having a plurality of die and a plurality of inter-die connections includes providing a semiconductor substrate S210, fabricating one or more circuitry layers on a plurality of die of the substrate S220, fabricating a plurality of inter-die connections S230, and reducing a size of the semiconductor substrate. The method 200 may optionally or alternatively include identifying a largest square of the substrate S215 and providing a protective barrier encompassing portions of the plurality of die S225.

Further, FIGS. 3A-3D illustrate several schematics of a semiconductor substrate, such as semiconductor 100, without and with interconnections. FIGS. 4A-4D illustrate several schematics of a semiconductor substrate, such as semiconductor 100, during exposure processes and size reduction.

2.2 Elastomeric Connector Assembly

Figure 5:
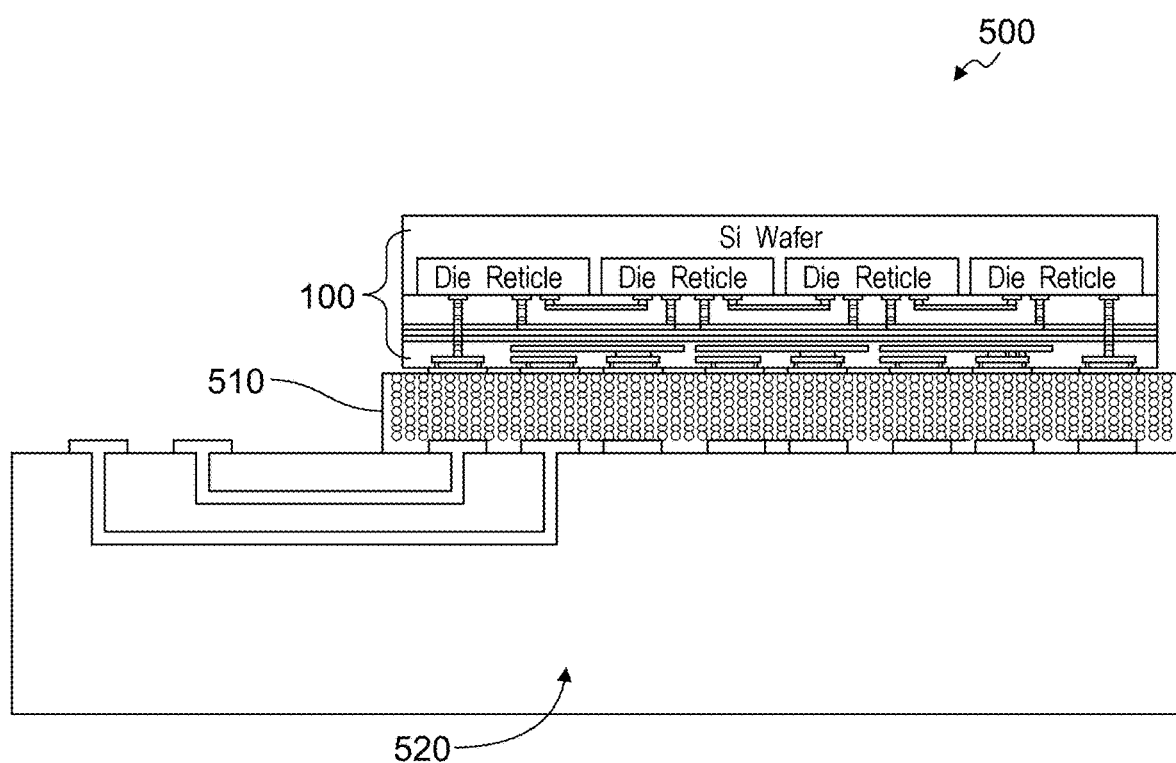
FIG. 5 illustrates a semiconductor assembly 500 in accordance with one or more embodiments of the present application.

As shown in FIG. 5, a schematic of a semiconductor assembly 500 includes an elastomeric connector 510 disposed between the semiconductor 100 and a circuit board 520.

The elastomeric connector 510 functions to secure the large semiconductor 100 to a circuit board 520. The elastomeric connector 510 preferably functions to place the semiconductor 100 and circuit board 520 in operable signal communication by conducting signals between them in a vertical direction (a direction normal to surfaces of both the semiconductor 100 and circuit board 520). Specifically, each of the semiconductor 100 and the circuit board 520 may include one or more conductive pads. The conductive pads of the semiconductor 100 may generally oppose the conductive pads of the circuit board 520 and may also, have a one-to-one alignment with each other. The elastomeric connector 510 is preferably designed to be interposed between the opposing surfaces of the conductive pads of both the semiconductor 100 and the circuit board 520. In this way, signals provided by a conductive pad of either the semiconductor 100 or the circuit board 520 may be transmitted through the elastomeric conductor 510 to an opposite conductive pad of the other of the semiconductor 100 and the circuit board 520.

Figure 6A:
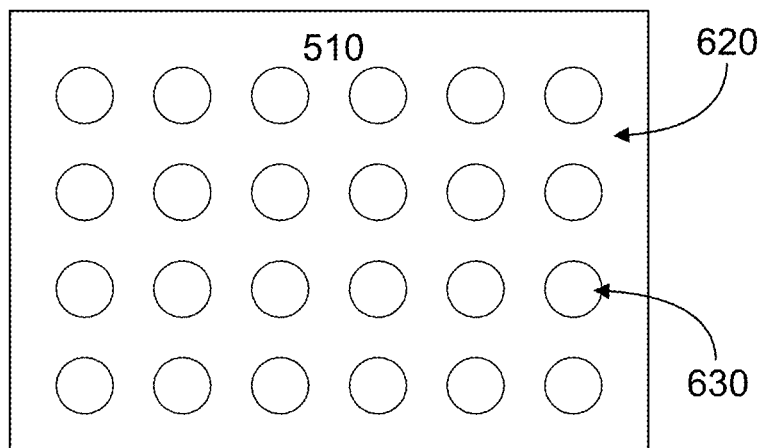
FIG. 6A-6B illustrate schematic examples of an elastomeric connector in accordance with one or more embodiments of the present application.

As shown in FIG. 6A, the elastomeric connector 510 includes a membrane 620 having a plurality of conductive elements 630. The membrane 620 may be any suitable material but is preferably made using silicon material.

Figure 6B:
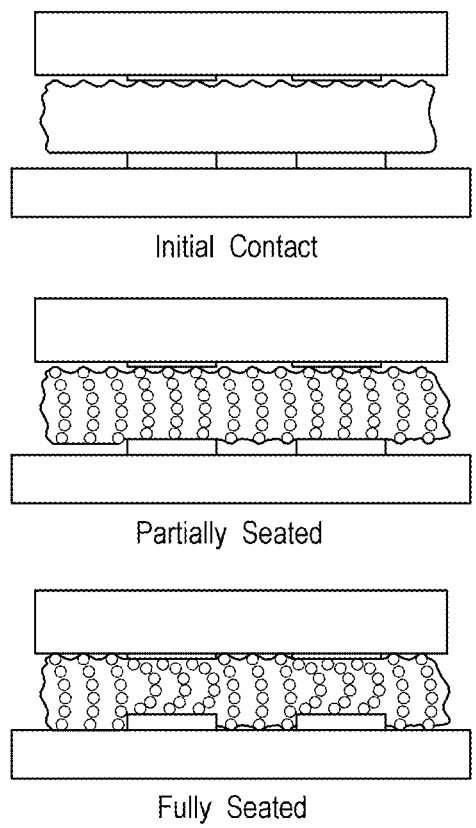

The plurality of conductive elements 630 may be any suitable conductive material that are arranged distributively and/or separately arranged within a body of the membrane 620. The plurality of conductive elements generally include a plurality of particles, such as ball wires, that when placed under compression (e.g., vertical compression) come into conductive contact with adjacent particles. That is, in a first state (of un-compression) in which the elastomeric connector 510 is not placed under a compressive load, the plurality of conductive elements 630 are preferably distributed within the body of the membrane 620 substantially (some contact) or fully independent (no contact) of each other. However, in a second state (of compression) in which the elastomeric connector 510 is placed under a compressive load, the plurality of conductive elements 630 preferably come into contact and may function to form multiple disparate conductive chains (conductive strings) or electrical paths from a first surface region of the elastomeric connector 510 to a second surface region (preferably opposing surface region)

of the elastomeric connector 510 that function to electrically connect the conductive pads of the semiconductor 100 and the conductive pads at the circuit board 520. As shown in FIG. 6B, when under compression, the plurality of conductive elements 630 only make contact vertically and not horizontally. However, it shall be noted that if a laterally compressive force were applied to the elastomeric connector 510, the plurality of conductive elements 630 would similarly come into contact to form an electrical signal path between the opposing surface regions of the elastomeric connector 510.

The plurality of conductive elements 630 may, additionally, function to provide an elastic effect or spring effect in one or more portions of the elastomeric connector 510 to generally resist compressive forces, shearing forces, and/or permanent deformations in the elastomeric connector 510. Accordingly, when one or more portions of the elastomeric connector 510 is placed under a load, the plurality of conductive elements 630 may elastically compress without allowing the elastomeric connector 510 to undergo permanent deformation. That is, even after a large load (e.g., four tons of pressure or the like) the plurality of conductive elements 630 are sufficiently elastic to allow the elastomeric connector 510 to regain its original form or substantially its original form when the elastomeric connector 510 is not placed under the large load.

In the case that the plurality of conductive elements 630 comprise metal ball wires, the elastic effect is achieved when a load is placed onto the elastomeric connector 510 thereby causing the ball wires to come into conductive and elastic contact with each other. The ball wires when in contact form a substantially vertical conductive path (or in some embodiments, a lateral conductive path), as shown by way of example in FIG. 6B. Additionally, or alternatively, a vertical spring or elastic chain in which the adjacent ball wires forming the vertical conductive path and spring may be permitted to slide against each other in a horizontal direction (e.g., in a direction normal to a direction of a load) and in the vertical direction (albeit slightly) while maintaining continuous contact. In some embodiments, adjacent surfaces of the ball wires, when in contact, are permitted to slide against each other in the conductive and elastic path allows the conductive and elastic path to shift (while maintaining conductive and elastic contact) and form an arc. The arc formed by the ball wires while under a compressive load may have varying radii along the arc. Additionally, the arcs formed by horizontally adjacent vertical conductive and elastic paths may have similar or different arcs depending on an amount of load applied thereon.

The arc-shaped configuration of the ball wires when placed under a compressive load preferably allows for significant deformation (e.g., beyond some deformation threshold) of the elastomeric connector 510 while allowing the ball wires to maintain signal communication between the semiconductor 110 and the circuit board 520 and also, allow the ball wires to elastically resist variable shearing forces along the elastomeric connector 510 by allowing radii along the signal conductive path or conductive chain formed thereby to shift or change according to varying shearing forces applied to the various sections of the signal conductive path. That is, because the semiconductor 100 may expand or contract at a different rate than the circuit board 520, shearing forces experienced along top portion or region of the elastomeric connector 510 may be different than the shearing forces experienced along a bottom portion or region of the elastomeric connector 510. Accordingly, the resulting shearing forces experienced along the signal conductive path formed by the plurality of ball wires (e.g., the plurality of conductive elements) may also vary from a top region to a bottom region of the elastomeric connector 510.

Further yet, the plurality of conductive elements 630 while under compression and while maintaining conductive contact function to enable a shearing force absorption effect while maintaining signal conductivity between the semiconductor 100 and the circuit board 520. A shearing effect or shearing force against the elastomeric connector 510 may generally be caused by a disparity between the CTE of the circuit board 520 and the semiconductor 100. The semiconductor 100 being preferably made of silicon material typically may not vary greatly, in terms of expansion (expands approximately at 3 parts per million) or contraction, during heating or cooling. The circuit board 520, however, which may include materials such as copper may expand and contract at a different rate (e.g., 17 parts per million). Of course, because the semiconductor 100 is large the corresponding circuit board 520 is large so that a heating effect (when powered) applied to the assembly 500 may mainly causes the circuit board 520 to expand so greatly relative to the semiconductor 100 on the opposite side of the elastomeric connector 510 to cause to a large shearing force and resulting shearing effect on the connector 510.

However, as mentioned above, the configuration of the ball wires (e.g., roundness or substantial roundness) allows the balls to shift or slide against each other and thereby absorb and resist the shearing force caused due to the heating of the circuit board 520 and the semiconductor with mismatched CTEs.

4. Method of Fabricating Distinct Connection Types of an Integrated Circuit

Figure 7:
FIG. 7 illustrates a method 700 in accordance with one or more embodiments of the present application.

As shown in FIG. 7, a method 700 of fabricating a plurality of distinct connection types of an integrated circuit includes performing a first fabrication of a first connection type S710, optionally testing a yield of the die of the wafer S720, performing a second fabrication of a second connection type S730, and reducing the wafer S740.

The method 700 includes a multistage process for fabricating circuit connections of various types onto a multi-die semiconductor and also, testing a multi-die semiconductor between distinct circuit connection fabrication processes. The circuit connections fabricated according to the method 700 preferably create connectivity that allows signals and power to come into and out of an active region of a multi-die interconnected semiconductor. Accordingly, the method 700 preferably includes a hierarchical approach to building circuitry connections using a mixture of exposures that may be applied in a sequential lithography process.

3.1 Fabricating First Connection Type

S710, which includes implementing a first fabrication of a first connection type, may function to implement a first fabrication of at least a first type of circuit connection within and/or between a plurality of distinct die of a multi-die interconnected semiconductor wafer. The first fabrication of at least the first type of circuit connection enables and preferably precedes one or more of a circuit testing phase of the plurality of distinct die of the multi-die interconnected wafer and a second fabrication phase of at least a second distinct connection type.

The at least first type of circuit connection (i.e., first connection type) preferably includes one or more granular connections that may be established on die. That is, the first connection type(s) established in the first fabrication may include relatively small or granular (relative to the coarse second connection type) connections that operate to connect circuits on each distinct or individual die of a multi-die interconnected wafer and may additionally include granular circuit connections that operate to connect pairs and/or adjacent die of the multi-die interconnected wafer. Accordingly, the first fabrication preferably includes fabricating a plurality of inter-die connections as well as a plurality of intra-die connections.

The fabrication of the first connection type may typically be considered a fabrication of on-die circuit connections because the multi-die interconnected wafer includes a single continuous (integral) form (die) that includes a plurality of individual die that are physically distinct from each other but are arranged within the single continuous form. That is, a plurality of distinct die may be formed by processing a single wafer to create a plurality of die on the single wafer in which the resulting plurality of die may be interconnected using the fabrications of the first connection type and without dicing or severing the individual die from a body of the single wafer. Accordingly, each of the plurality of distinct die along the semiconductor wafer are connected at least via the semiconductor material of the wafer at a time of the one or more distinct fabrications of circuit connections described herein.

Additionally, S710 may function to fabricate the first connection type along a multi-die interconnected wafer preferably using a single photomask or a single reticle. It shall be noted that any suitable number of masks may be used. In a preferred embodiment, a single large mask that covers an area including a plurality of die may be exposed in a (single-shot) lithographic process to form intra-die and inter-die connections. A single-shot as referred to herein preferably relates to a process of exposing a reticle or a photomask with a single application of light. Alternatively, in some embodiments, multiple masks may be implemented to separately form the intra-die connections and inter-die connections, respectively, along the multi-die interconnected wafer. In such embodiments, the lithographic process may include multiple exposures to achieve the circuit connections with the multiple masks.

In a first implementation, S710 may function to implement a single photomask (i.e., intra-die connection mask) that includes connection data and/or a circuit connection design that enables a fabrication of intra-die (i.e., within an individual die) circuit connections for each of a plurality of distinct die of a wafer at a same time. That is, S710 may function to perform a single shot exposure of the single photomask for creating the circuit connections for an active circuitry surface or layer of each distinct die of a plurality of distinct die of a single, continuous semiconductor wafer.

Further, in the first implementation, S710 may function to implement a second single photomask (i.e., inter-die connection mask) that includes connection data and/or a circuit connection design that enables a fabrication of inter-die (i.e., between two distinct die) circuit connection between one or more pairs of a plurality of distinct die of a semiconductor wafer. That is, S710 may function to perform a single shot exposure of the single photomask for creating the circuit connections between and/or that connection two distinct die of a plurality of distinct die of a single, continuous semiconductor wafer.

In a second implementation, S710 may function to implement a single photomask that includes connection data and/or a circuit connection design that enables a fabrication of a combination of inter-die circuit connections and intra-die circuit connection at the same time using a single exposure.

3.2 Circuit Testing

Optionally, or additionally, 720, which includes testing one or more attributes of the multi-die interconnected wafer, may function to evaluate and/or test one or more attributes and functionalities of the multi-die interconnected wafer after a completion of the first fabrication (S710). In particular, a technical benefit achieved in the method 700 includes that by splitting a fabrication of the connections (i.e., first connection types and second connection types) enables an intermediate testing of a multi-die interconnected wafer for operability and/or defects in manufacture. In traditional manufacture of circuit connections of a die, testing may typically be performed before or after all circuit connections are made. Thus, it is possible to fabricate all circuit connections on a die that may be defective. In the context of the present application, since the multi-die interconnected wafer includes a plurality of die rather than individual die (as in traditional circuitry), it becomes increasingly technically beneficial and/or technically important to test attributes and functionality of the multiple distinct die midstream of the circuit connection fabrication process to avoid downstream fabrication of a multi-die interconnected wafer with a low yield in a number of functional die on the wafer.

Accordingly, S720 may generally function to test any suitable attribute or feature of a multi-die interconnected wafer. In a preferred embodiment, S720 may function to measure and/or test a yield of the multi-die interconnected wafer. In this preferred embodiment, S720 may function to measure and/or identify a yield of the functional die on the multi-die interconnected wafer. That is, S720 may function to determine a number of the plurality of distinct die on the wafer that are operable and/or functional after the first fabrication compared to the total number of die on the wafer.

In some embodiments, if a measured yield value of a multi-die interconnected wafer satisfies and/or exceeds a yield threshold, S720 may function to automatically pass the multi-die connected wafer to a subsequent fabrication process (e.g., the second fabrication of circuit connections). In a preferred embodiment, the yield threshold preferably relates to a minimum number of operable and/or successfully tested die of a multi-die semiconductor wafer. Alternatively, in some embodiments, if a measured yield value of a multi-die interconnected wafer does not satisfy and/or exceed a yield threshold, S720 may function to cease further fabrication processing of the multi-die interconnected wafer and/or revert the wafer for repairs or disposal.

3.3 Fabrication of Second Connection Types

Figure 8:
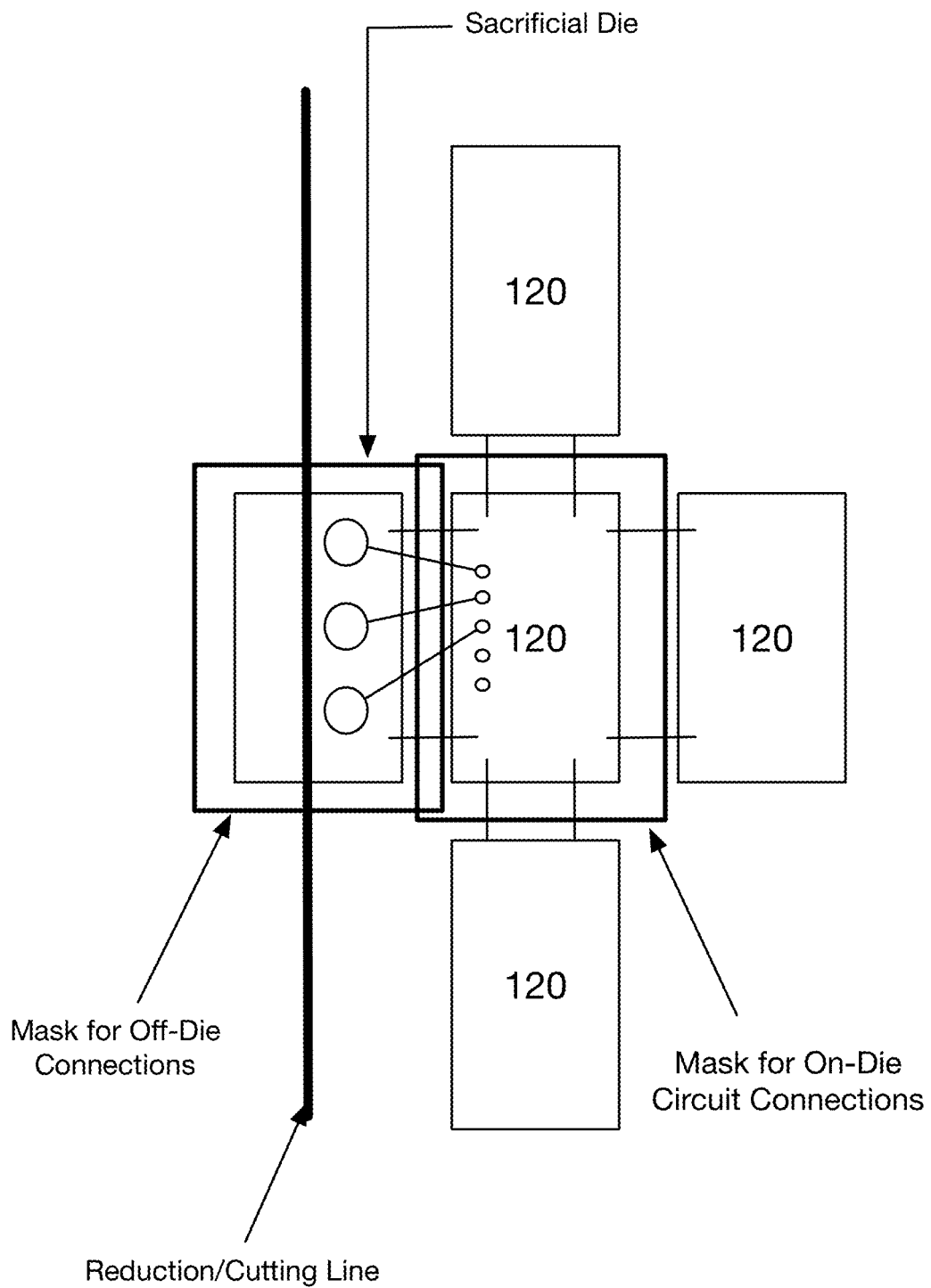
FIG. 8 and FIG. 9 illustrate a first and second example of a schematic of a semiconductor substrate with masks forming connections in accordance with one or more embodiments of the present application, respectively.
Figure 9:
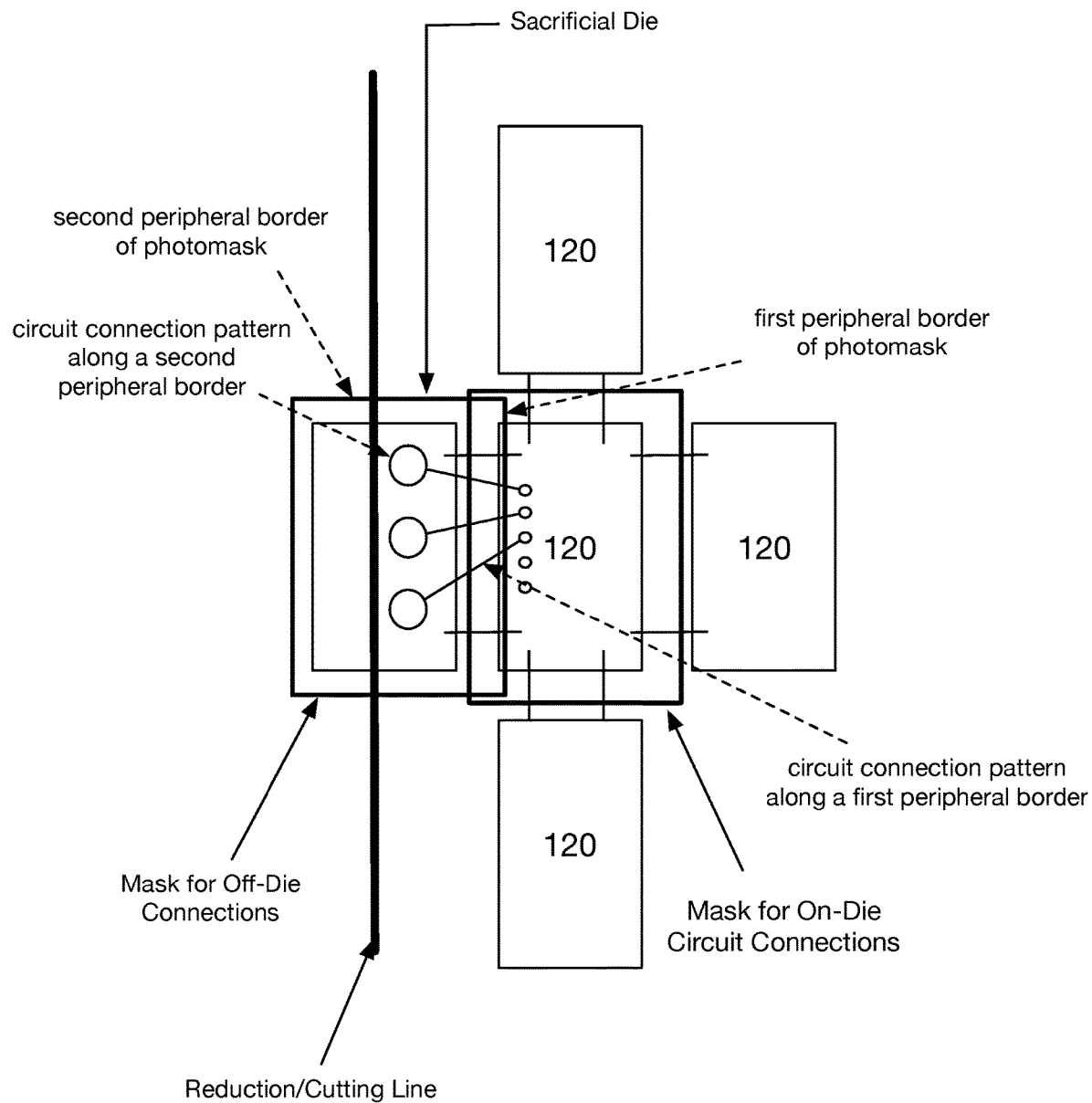

S730, which includes implementing a second fabrication of a second connection type, may function to implement a second fabrication of at least a second type of circuit connection using a distinct reticle or photomask that enables off-active die connections to external circuits, external sources (e.g., off-chip power sources, peripheral devices, etc.), and/or the like, as shown by way of example in FIG. 8. In some embodiments, the second fabrication of at least the second type of circuit connection(s) may be triggered by one or more testing values (e.g., yield) testing values measured in a preceding testing phase.

The at least second type of circuit connection (i.e., second connection type) preferably includes one or more coarse connections that may function to connect the on-die elements of a multi-die interconnected wafer to one or more off-die elements or components. That is, the second connection type(s) established in the second fabrication may include relatively large or coarse circuit connections that operate to connect the active circuits of the multi-die interconnected wafer to off-die elements, such as input/output elements, off-die storage elements, energy sources, and the like.

Accordingly, the fabrication of the second connection type(s) may typically be considered a fabrication of off-die circuit connections because while the granular circuit connections may include circuit connections at one end to the (on-die) active circuits and/or active die of a multi-die interconnected wafer, the opposing end of each granular circuit connection may be connected to an off-die support or inactive circuit element, such as a sacrificial die.

One or more examples of second connection types include, but is not limited to, input/output connections or fan-outs, power distributions connections, circuit connections to off-die memory or storage media, and the like.

Preferably, S730 preferably functions to fabricate a plurality of granular and/or off-die circuit connections along one or more peripheral edges or columns of a multi-die interconnected wafer using a single masks. In some embodiments, S730 may function to fabricate a plurality of off-active die circuit connections along a first column and a last column of a multi-die interconnected wafer. For instance, S730 may function to fabricate I/O connections and power redistribution connections along the first column and last column of active die of a multi-die interconnected wafer. In other embodiments, S730 may function to fabricate a plurality of off-active die circuit connections along a first row and a last row of a multi-die interconnected wafer. It shall be noted that S730 may function to fabricate off-active die circuit connections along any or all sides of a multi-die interconnected die.

3.3.1 Sacrificial Die-Supported Fan-Out/Peripheral Connections

As described above, S730 may function to fabricate coarse circuit connections along one or more peripheral boundaries or regions of a multi-die interconnected wafer based on a lithographic exposure process that preferably enables a use of a single photomask or the like to create connection circuits along a plurality of distinct die of the multi-die interconnected wafer. In a preferred embodiment, the multi-die interconnected semiconductor may include at least two distinct regions including a first region of active die and a second region of inactive die (e.g., sacrificial die, etc.). With respect to the second region, the second region may include one or more peripheral regions (i.e., boundaries) of the multi-die interconnected wafer. The one or more peripheral regions preferably include a plurality of inactive die that may function as supports or as substrates for one or more circuit connections including, but not limited to, fan-out connections for connecting the active die region to peripheral devices (e.g., input/output devices, etc.), to external devices, to other distinct layers (e.g., upstream and/or downstream layers) of semiconductor wafers, and/or the like.

Accordingly, with respect to the fabrication of peripheral circuit connections, such as I/O connections, which may sometimes be referred to herein as fan-out connections, S730 may preferably function to fabricate fan-out circuit connections such that the connections extend from the first region of a multi-die interconnected wafer having a plurality of active die to the one or more second (peripheral) regions having a plurality of inactive die and/or sacrificial die. That is, in such embodiments, S730 enables uses the one or more areas beyond the plurality of active die of the wafer to be used to fan-out coarse connections and use the area beyond defined by the plurality of sacrificial die and/or inactive die as a substrate or a support structure for the coarse connections of the fan-outs.

It shall be noted that in some circumstances distinct and more time-consuming manufacturing techniques may be used to fabricate the first type of connections (i.e., the fine pitch connections) on each die and to fabricate the second type of connections (e.g., the coarse pitch connections) that extend from the die to a printed circuit board or the like. In these type of circumstances, the several coarse connections (e.g., I/O connections or the like) may not fit within a surface area of a die and thus, are typically extended to another piece of material that is larger than the die. That is, a separate substrate may be used for supporting coarse fan-out connections and the like. Accordingly, at least one technical advantage of the above-described technique of S730 becomes apparent in that a same silicon substrate (i.e., the multi-die semiconductor wafer) on which active integrated circuits are created may also be used to create coarse fan-out connections and consequently, a need for a distinct support substrate to support the coarse fan-out connections is mitigated or ameliorated completely.

Additionally, or alternatively, the single mask preferably comprises a single large mask (e.g., a mask that exceeds a size threshold for covering and enabling an exposure of multiple distinct die at a same time) that encompasses or covers an area of the multi-die interconnected wafer that includes the plurality of active interconnected die and areas that include sacrificial die. Accordingly, the single mask in such preferred embodiments may be sufficiently large to enable a lithographic process to fabricate all or substantially all off-active die or granular circuit connections with the single mask and with a single exposure (i.e., a single-shot exposure). A technical benefit of such a largely configured mask includes faster connection circuitry fabrication relative to traditional fabrication processes that require multiple masks and therefore, multiple exposures to achieve comparable connection circuitry.

It shall be noted that a single mask may include a plurality of distinct off-active die circuit connection architectures or designs, such that as a result of an exposure of the single mask each of a plurality of sides of a multi-die interconnected wafer may include distinct off-active die circuit connections. For example, a first side of the single mask may include a design for fabricating I/O circuit connections on a first side of a wafer and a second side of the of the single mask may include a second design for fabricating power redistribution connections on a second side of the wafer.

It shall also be noted that while it is preferable to implement a single large mask for fabricating the external circuit connections along a multi-die interconnected wafer, it may also be possible to use multiple masks that may independently be used to fabricate the external circuit connections along each distinct side of a multi-die interconnected wafer. For instance, in one example a first mask may be implemented to form external circuit connections along a first and last column of a multi-die interconnected wafer and a second mask may be implemented to form external circuit connections along a first and last row of the multi-die interconnected wafer.

3.4 Wafer Reduction

S740, which includes reducing the wafer, may function to reduce and/or cut through a multi-die interconnected wafer along supports of the off-active die or granular circuit connections. That is, in a preferred embodiment, once fabrication of the first connection types and the second connection types are completed, S740 may function to reduce a size of the multi-die wafer to eliminate excess material and excess die. In such preferred embodiment, S740 may function to reduce the multi-die wafer by cutting through one or more rows and/or one or more columns of sacrificial die abutting and/or proximate to the active die sections of the multi-die wafer.

Specifically, S740 may function to cut through the sacrificial die that supports at least one end of each of the off-active die circuit connections. In this way, a resultant wafer comprising a reduced multi-die interconnected wafer may include a plurality of sacrificial die that are partial die (remainder of a full die) and that operate to support the plurality of off-active die connections of the wafer. In a preferred embodiment, the sacrificial die are exposed due to the cut made through the die and therefore, may not support power, may not include a seal ring, and/or the like.

It shall be understood that the method 700 is an exemplary method that may be implemented in any suitable order to achieve the inventions and/or embodiments of the inventions within the purview or that may be easily contemplated in view of the disclosure provided herein. Thus, the order and process steps should not be limited to the exemplary order provided herein.

The methods of the preferred embodiment and variations thereof can be embodied and/or implemented at least in part as a machine configured to receive a computer-readable medium storing computer-readable instructions. The instructions are preferably executed by computer-executable components preferably integrated with the lithography system and one or more portions of the processors and/or the controllers implemented thereby. The computer-readable medium can be stored on any suitable computer-readable media such as RAMs, ROMs, flash memory, EEPROMs, optical devices (CD or DVD), hard drives, floppy drives, or any suitable device. The computer-executable component is preferably a general or application specific processor, but any suitable dedicated hardware or hardware/firmware combination device can alternatively or additionally execute the instructions.

Although omitted for conciseness, the preferred embodiments include every combination and permutation of the various methods, apparatus, and systems described herein.

As a person skilled in the art will recognize from the previous detailed description and from the figures and claims, modifications and changes can be made to the preferred embodiments of the invention without departing from the scope of this invention defined in the following claims.

What is claimed is:

1. A method for fabricating distinct types of circuit connections on a semiconductor wafer, the method comprising:
    fabricating, using a first photomask, a plurality of a first type of circuit connections for each of a plurality of distinct die of a semiconductor wafer; and
    fabricating, using a second photomask, a plurality of a second type of circuit connections between a plurality of distinct pairs of components of the semiconductor wafer,
    wherein each distinct pair of components includes at least one distinct die of the plurality of distinct die and a conductive pad, wherein:
    a circuit connection design of the first photomask produces granular circuit connections along the semiconductor wafer,
    a circuit connection design of the second photomask produces coarse circuit connections along the semiconductor wafer, and
    the coarse circuit connections produced by the second photomask are larger than the granular circuit connections of the first photomask.

2. The method according to claim 1, wherein
the fabrication using the first photomask includes:
    performing a single-shot exposure of the first photomask to create at a same time the plurality of the first type of circuit connections between a plurality of distinct pairs of the plurality of distinct die of the semiconductor wafer.

3. The method according to claim 1, wherein
the fabrication using the first photomask includes:
    performing a single-shot exposure of the first photomask to create at a same time the plurality of the first type of circuit connections within each of the plurality of distinct die of the semiconductor wafer.

4. The method according to claim 1, wherein
the fabrication using the second photomask includes:
    performing a single-shot exposure of the second photomask to create at a same time the plurality of the second type of circuit connections between each of the plurality of distinct pairs of components.

5. The method according to claim 1, wherein:
the first photomask includes a plurality of distinct circuit connection patterns, wherein each one of the plurality of distinct circuit connection patterns corresponds to one of the plurality of distinct die of the semiconductor wafer;
the fabrication using the first photomask includes:
    arranging the first photomask over all the plurality of distinct die of the semiconductor wafer,
    exposing the first photomask and transferring at a same time each one of the plurality of distinct circuit connection patterns to a respective one of the plurality of distinct die of the semiconductor wafer.

6. The method according to claim 1, wherein:
the second photomask includes a plurality of distinct circuit connection patterns along at least one peripheral boundary of the second photomask, wherein each one of the plurality of distinct circuit connection patterns corresponds to one of the plurality of distinct pairs of components of the semiconductor wafer;
the fabrication using the second photomask includes:
    arranging the second photomask over a peripheral region of the semiconductor wafer,
    exposing the second photomask and transferring at a same time each one of the plurality of distinct circuit connection patterns to a respective one of the plurality of distinct pairs of components of the semiconductor wafer.

7. The method according to claim 1, wherein:
the plurality of distinct die of the semiconductor wafer include a first column of die along a first peripheral boundary of the semiconductor wafer and a second column of die along a second peripheral boundary of the semiconductor wafer;
the second photomask includes:
    (i) a first circuit connection pattern for a first plurality of the second type of circuit connections along a first peripheral border of the second photomask;
    (ii) a second circuit connection pattern for a second plurality of the second type of circuit connections along a second peripheral border of the second photomask;

the fabrication using the second photomask includes:
arranging the second photomask over the first column of die and the second column of die of the semiconductor wafer,
exposing the second photomask and transferring at a same time the first circuit connection pattern and the second circuit connection pattern, respectively, to the first column of die and the second column of die of the semiconductor wafer.

8. The method according to claim 1, wherein
the plurality of the first type of circuit connections the first photomask include:
(i) a first circuit connection pattern for fabricating intra-die circuit connections within each one of the plurality of distinct die of the semiconductor wafer; and
(ii) a second circuit connection pattern for fabricating inter-die circuit connections between distinct pairs of the plurality of distinct die of the semiconductor wafer.

9. The method according to claim 8, wherein
the fabrication using the first photomask of the plurality of first type of circuit connections includes:
implementing a single exposure of the first photomask that transfers at a same time the first circuit connection pattern and the second circuit connection pattern to the plurality of distinct die of the semiconductor wafer.

10. The method according to claim 1, further comprising:
exposing the first photomask that provides the plurality of the first type of circuit connections; and
subsequently, exposing the second photomask that provides the plurality of the second type of circuit connections,
wherein the plurality of the first type of circuit connections are distinct from the plurality of the second type of circuit connections.

11. The method according to claim 1, further comprising:
subsequent to the fabrication of the plurality of the first type of circuit connections and before the fabrication of the plurality of the second type of circuit connections, performing a circuit testing of the plurality of distinct die of the semiconductor wafer prior to the fabrication of the plurality of second type of circuit connections,
wherein the circuit testing includes:
measuring a number of functioning die of the plurality of distinct die of the semiconductor wafer, and
computing a functional die yield based on the number of functioning die.

12. The method according to claim 11, wherein
the fabrication of the plurality of the second type of circuit connections is based the functional die yield satisfying or exceeding a yield threshold.

13. The method according to claim 1, wherein
the plurality of the first type of circuit connections include if inter-die circuit connections between distinct pairs of the plurality of distinct die of the semiconductor wafer, wherein the inter-die circuit connections communicatively connect distinct pairs of die;
the fabrication using the first photomask includes exposing the first photomask over the plurality of distinct die while the semiconductor wafer is in an un-diced state, wherein in the un-diced state each distinct die of the plurality of die are connected via a material of the semiconductor wafer and are not individually severed.

14. The method according to claim 1, further comprising:
reducing a size of the semiconductor wafer based on a completion of the fabrication of the plurality of the first type of circuit connections and the fabrication of the plurality of the second type of circuit connections.

15. The method according to claim 14, wherein
reducing the size of the semiconductor wafer includes:
severing excess material from the semiconductor wafer by cutting through a column of die of the plurality of distinct die of the semiconductor wafer.

16. The method according to claim 1, wherein
fabricating the plurality of the second type of circuit connections includes:
fabricating, at each distinct pair of components, a circuit connection of the second type that extends from a first region of the semiconductor wafer having a plurality of active die and one or more second regions of the semiconductor wafer having a plurality of sacrificial die that support a coarse end of the circuit connection,
wherein the plurality of sacrificial die include a plurality of inactive die arranged along one or more peripheral regions of the semiconductor wafer.

17. The method according to claim 1, wherein
the second photomask includes a distinct circuit connection design that enables a fabrication of circuit connections of the second type that extend between a first region of the semiconductor wafer that includes a plurality of active die and one or more second regions of the semiconductor wafer that include a plurality of inactive die that define a supporting substrate to one end of each circuit connection of the second type.

18. The method according to claim 17, wherein
the circuit connections of the second type comprise fan-out circuit connections, and
the plurality of inactive die support the fan-out circuit connections.

19. A method for fabricating circuits using a mixed exposure of reticles, the method comprising:
arranging a first reticle over a plurality of die of a wafer, the first reticle including a first circuit pattern for each of the plurality of die of the wafer;
implementing a single exposure of the first reticle that transfer the first circuit pattern to each of the plurality of die of the wafer;
subsequently, arranging a second reticle over the plurality of die of the wafer, the second reticle including a second circuit pattern for a plurality of die along one or more peripheral regions of the wafer; and
implementing a single exposure of the second reticle that transfers the second circuit pattern to each of the plurality of die along the one or more peripheral regions of the wafer, wherein:
a circuit connection design of the first photomask produces granular circuit connections along the semiconductor wafer,
a circuit connection design of the second photomask produces coarse circuit connections along the semiconductor wafer, and
the coarse circuit connections produced by the second photomask are larger than the granular circuit connections of the first photomask.

20. A method for fabricating distinct types of circuit connections on a semiconductor wafer, the method comprising:

fabricating, using a first photomask, a plurality of a first type of circuit connections for each of a plurality of distinct die of a semiconductor wafer; and fabricating, using a second photomask, a plurality of a second type of circuit connections between a plurality of distinct pairs of components of the semiconductor wafer, wherein each distinct pair of components includes at least one distinct die of the plurality of distinct die and a conductive pad, wherein fabricating the plurality of the second type of circuit connections includes:

fabricating, at each distinct pair of components, a circuit connection of the second type that extends from a first region of the semiconductor wafer having a plurality of active die and one or more second regions of the semiconductor wafer having a plurality of sacrificial die that support a coarse end of the circuit connection, wherein the plurality of sacrificial die include a plurality of inactive die arranged along one or more peripheral regions of the semiconductor wafer.

* * * * *